(12) United States Patent
Ichikawa et al.

(10) Patent No.: US 10,419,685 B2
(45) Date of Patent: Sep. 17, 2019

(54) IMAGE PROCESSING APPARATUS, IMAGE PROCESSING METHOD, AND COMPUTER-READABLE RECORDING MEDIUM

(71) Applicant: OLYMPUS CORPORATION, Tokyo (JP)

(72) Inventors: Manabu Ichikawa, Hachioji (JP); Hiroki Maruyama, Hino (JP)

(73) Assignee: OLYMPUS CORPORATION, Tokyo (JP)

(*) Notice: Subject to any disclaimer, the term of this patent is extended or adjusted under 35 U.S.C. 154(b) by 38 days.

(21) Appl. No.: 15/698,717

(22) Filed: Sep. 8, 2017

(65) Prior Publication Data

US 2017/0374260 A1    Dec. 28, 2017

Related U.S. Application Data

(63) Continuation of application No. PCT/JP2015/057377, filed on Mar. 12, 2015.

(51) Int. Cl.
*H04N 5/235* (2006.01)
*H04N 9/07* (2006.01)
(Continued)

(52) U.S. Cl.
CPC .......... *H04N 5/2352* (2013.01); *G01J 3/28* (2013.01); *H04N 1/603* (2013.01);
(Continued)

(58) Field of Classification Search
CPC .... H04N 1/603; H04N 1/6041; H04N 5/2352; H04N 5/357; H04N 9/045; H04N 9/0451;
(Continued)

(56) References Cited

U.S. PATENT DOCUMENTS 6,256,062 B1 * 7/2001 Endo ............... H04N 9/735
  348/188
6,943,837 B1 * 9/2005 Booth, Jr. ............ H04N 5/3537
  348/223.1
(Continued)

FOREIGN PATENT DOCUMENTS

JP    2007-010364 A    1/2007
JP    2010-190741 A    9/2010
(Continued)

OTHER PUBLICATIONS

Extended Supplementary European Search Report dated Sep. 24, 2018 in European Patent Application No. 15 88 4626.1.
(Continued)

*Primary Examiner* — Lin Ye
*Assistant Examiner* — Chriss S Yoder, III
(74) *Attorney, Agent, or Firm* — Scully, Scott, Murphy & Presser, P.C.

(57) ABSTRACT

An image processing apparatus includes a correction factor calculating unit configured to calculate a correction factor for correcting a difference in pixel values corresponding to a difference between a spectral sensitivity and a preset reference spectral sensitivity in a predetermined wavelength range at a pixel of interest, based on image data generated by an image sensor, the image sensor having a plurality of pixels on which color filters of a plurality of colors with different spectral transmittances are respectively disposed, the color filters forming a predetermined array pattern, the correction factor calculating unit being configured to calculate the correction factor for each of the plurality of pixels on which at least a predetermined color filter of the color filters is disposed.

15 Claims, 27 Drawing Sheets

(51) Int. Cl.
*H04N 5/357* (2011.01)
*H04N 9/04* (2006.01)
*G01J 3/28* (2006.01)
*H04N 1/60* (2006.01)
*H04N 9/67* (2006.01)
*H01L 27/146* (2006.01)
*H01L 27/148* (2006.01)

(52) U.S. Cl.
CPC ........... *H04N 1/6041* (2013.01); *H04N 5/357* (2013.01); *H04N 9/045* (2013.01); *H04N 9/0451* (2018.08); *H04N 9/07* (2013.01); *H04N 9/67* (2013.01); *H01L 27/14621* (2013.01); *H01L 27/14645* (2013.01); *H01L 27/14868* (2013.01); *H04N 2209/042* (2013.01)

(58) Field of Classification Search
CPC ...... H04N 9/07; H04N 9/67; H04N 2209/042; H01L 27/14621; H01L 27/14645; H01L 27/14868; G01J 3/28
See application file for complete search history.

(56) References Cited

U.S. PATENT DOCUMENTS

| | | | |
|---|---|---|---|
| 7,760,253 B2* | 7/2010 | DiCarlo | H04N 17/002 348/223.1 |
| 8,330,833 B2* | 12/2012 | Suzuki | H04N 1/6052 348/222.1 |
| 2006/0290929 A1 | 12/2006 | Imura | |
| 2011/0069210 A1 | 3/2011 | Ogura et al. | |
| 2016/0065925 A1 | 3/2016 | Sawadaishi et al. | |

FOREIGN PATENT DOCUMENTS

| | | |
|---|---|---|
| JP | 2010-193378 A | 9/2010 |
| WO | 2009/142641 A1 | 11/2009 |
| WO | 2010/123499 A1 | 10/2010 |
| WO | 2014/185209 A1 | 11/2014 |

OTHER PUBLICATIONS

International Search Report dated Jun. 2, 2015 issued in PCT/JP2015/057377.

* cited by examiner

IMAGE PROCESSING APPARATUS, IMAGE PROCESSING METHOD, AND COMPUTER-READABLE RECORDING MEDIUM

CROSS REFERENCES TO RELATED APPLICATIONS

This application is a continuation of PCT international application Ser. No. PCT/JP2015/057377, filed on Mar. 12, 2015 which designates the United States, incorporated herein by reference.

BACKGROUND

1. Technical Field

The disclosure relates to an image processing apparatus, an image processing method, and a computer-readable recording medium for calculating a correction factor for correcting spectral sensitivity characteristics of a plurality of pixels of an image sensor.

2. Related Art

In related art, for imaging devices such as digital cameras, a technology for adjusting variation in spectral sensitivity of pixels for each image sensor has been known, where such variation in spectral sensitivity of pixels is caused by variation in spectral transmittance of color filters provided on light receiving surfaces of image sensors such as a charge coupled device (CCD) or a complementary metal oxide semiconductor (CMOS) (refer to JP 2010-193378 A). According to this technology, photoelectric conversion is performed by an image sensor on visible light resulting from spectral dispersion with a prism, so that respective values of R (red), G (green), and B (blue) components based on respective wavelength ranges are calculated from image data composed of the color components of R, G, and B, and factors by which the values of R, G, and B are multiplied are calculated such that the differences between the calculated values of R, G, and B and reference values calculated in advance for the respective wavelength ranges become smaller.

SUMMARY

In some embodiments, an image processing apparatus includes a correction factor calculating unit configured to calculate a correction factor for correcting a difference in pixel values corresponding to a difference between a spectral sensitivity and a preset reference spectral sensitivity in a predetermined wavelength range at a pixel of interest, based on image data generated by an image sensor, the image sensor having a plurality of pixels on which color filters of a plurality of colors with different spectral transmittances are respectively disposed, the color filters forming a predetermined array pattern, the correction factor calculating unit being configured to calculate the correction factor for each of the plurality of pixels on which at least a predetermined color filter of the color filters is disposed.

In some embodiments, an image processing method is executed by an image processing apparatus. The method includes: acquiring image data generated by an image sensor, the image sensor having a plurality of pixels on which color filters of a plurality of colors with different spectral transmittances are respectively disposed, the color filters forming a predetermined array pattern; and calculating a correction factor for correcting a difference in pixel values corresponding to a difference between a spectral sensitivity and a preset reference spectral sensitivity in a predetermined wavelength range at a pixel of interest, based on the image data, for each of the plurality of pixels on which at least a predetermined color filter of the color filters is disposed.

In some embodiments, provided is a non-transitory computer-readable recording medium with an executable program stored thereon. The program causes an image processing apparatus to execute: acquiring image data generated by an image sensor, the image sensor having a plurality of pixels on which color filters of a plurality of colors with different spectral transmittances are respectively disposed, the color filters forming a predetermined array pattern; and calculating a correction factor for correcting a difference in pixel values corresponding to a difference between a spectral sensitivity and a preset reference spectral sensitivity in a predetermined wavelength range at a pixel of interest, based on the image data, for each of the plurality of pixels on which at least a predetermined color filter of the color filters is disposed.

The above and other features, advantages and technical and industrial significance of this invention will be better understood by reading the following detailed description of presently preferred embodiments of the invention, when considered in connection with the accompanying drawings.

DETAILED DESCRIPTION

Exemplary embodiments of the present invention will now be described with reference to the drawings. The present invention is not limited to the embodiments described below. The same reference signs are used to designate the same elements throughout the drawings.

First Embodiment

Configuration of Imaging System

Figure 1:
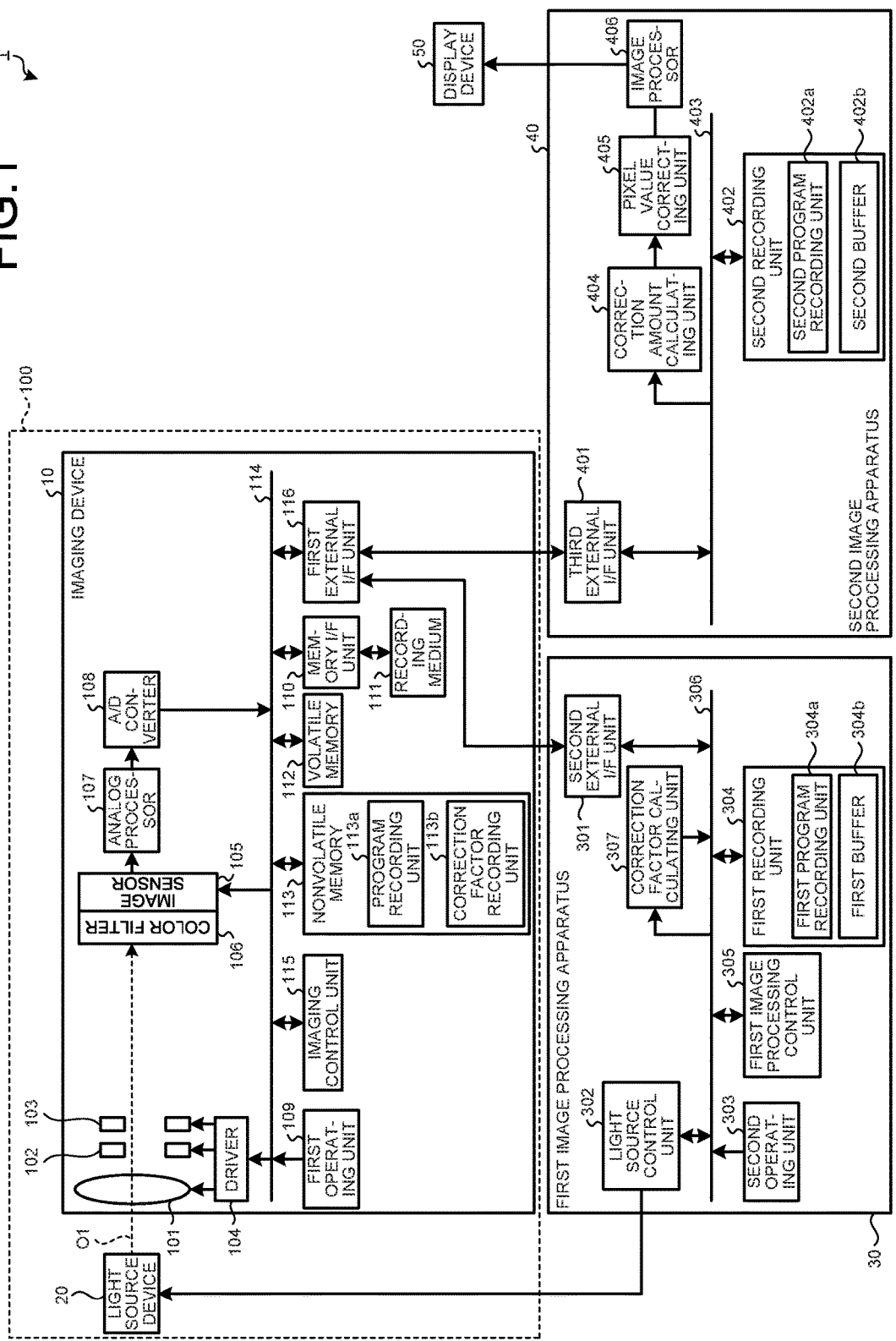
FIG. 1 is a block diagram schematically illustrating a configuration of an imaging system according to a first embodiment of the present invention.

FIG. 1 is a block diagram schematically illustrating a configuration of an imaging system according to a first embodiment of the present invention. For calculation of a correction factor, which will be described later, an imaging system 1 illustrated in FIG. 1 is located in a casing 100 in which a light-shielded space protected from external light is formed. For normal capturing, the imaging system 1 illustrated in FIG. 1 is located outside of the casing 100. The imaging system 1 includes an imaging device 10, a light source device 20 (object), a first image processing apparatus 30, a second image processing apparatus 40, and a display device 50. The first image processing apparatus 30, the second image processing apparatus 40, and the display device 50 may also be located outside of the casing 100 in calculation of a correction factor to be descried later.

Configuration of Imaging Device

First, a configuration of the imaging device 10 will be described. The imaging device 10 includes an optical system 101, a diaphragm 102, a shutter 103, a driver 104, an image sensor 105, a color filter 106, an analog processor 107, an A/D converter 108, a first operating unit 109, a memory interface (I/F) unit 110, a recording medium 111, a volatile memory 112, a nonvolatile memory 113, a bus 114, an imaging control unit 115, and a first external I/F unit 116.

The optical system 101 includes a single lens or a plurality of lenses. For example, the optical system 101 includes a focusing lens and a zoom lens.

The diaphragm 102 adjusts exposure by limiting the amount of incident light collected by the optical system 101. The diaphragm 102 limits the amount of incident light collected by the optical system 101 under the control of the imaging control unit 115. The amount of incident light may alternatively be controlled by the shutter 103 or an electronic shutter of the image sensor 105 instead of the diaphragm 102.

The shutter 103 sets the state of the image sensor 105 to an exposed state or a light-shielded state under the control of the imaging control unit 115. The shutter 103 is a focal-plane shutter, for example. Alternatively, the electronic shutter of the image sensor 105 may be used instead of the shutter 103.

The driver 104 drives the optical system 101, the diaphragm 102, and the shutter 103 under the control of the imaging control unit 115, which will be described later. For example, the driver 104 changes the zoom magnification or adjusts the point of focus of the imaging device 10 by moving the optical system 101 along an optical axis O1.

The image sensor 105 receives light collected by the optical system 101, converts the received light into image data (electrical signals), and output the image data under the control of the imaging control unit 115, which will be described later. The image sensor 105 is constituted by an image sensor such as a complementary metal oxide semiconductor (CMOS) or a charge coupled device (CCD) in which a plurality of pixels are arranged two-dimensionally. In addition, the image sensor 105 has an electronic shutter function capable of electronically controlling the amount of received light.

The color filter 106 is disposed on a light receiving surface of the image sensor 105. The color filter 106 includes a plurality of color filters for transmitting light of different wavelength ranges. The plurality of color filters, which constitutes an array pattern, is respectively located on the plurality of pixels of the image sensor 105.

Figures 2, 3:
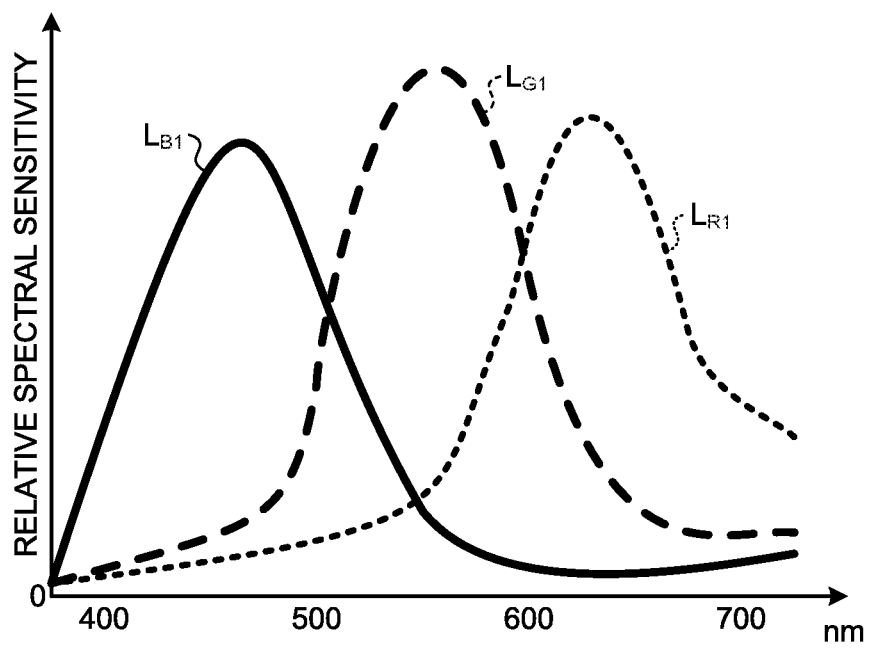
FIG. 2 is a diagram schematically illustrating a configuration of a color filter according to the first embodiment of the present invention.
FIG. 3 is a graph illustrating respective averages of spectral sensitivity characteristics of R pixels, G pixels, and B pixels constituting an image sensor according to the first embodiment of the present invention.

FIG. 2 is a diagram schematically illustrating the configuration of the color filter 106. The color filter 106 illustrated in FIG. 2 includes filters R that transmit light in the red wavelength range, filters G that transmit light in the green wavelength range, and filters B that transmit light in the blue wavelength range in a Bayer array, which are provided on light receiving surfaces of the pixels of the image sensor 105. In the following description, the pixels on the light receiving surfaces of which the filters R are disposed will be referred to as R pixels, the pixels on the light receiving surfaces of which the filters G are disposed will be referred to as G pixels, and the pixels on the light receiving surfaces of which the filters B are disposed will be referred to as B pixels.

The analog processor 107 performs predetermined analog processing on an analog signal output from the image sensor 105, and outputs the processed signal to the A/D converter 108. Specifically, the analog processor 107 performs noise reduction, gain enhancement, and the like on an analog signal input from the image sensor 105. For example, the analog processor 107 reduces reset noise and the like in the analog signal, then performs waveform shaping thereon, and further enhances the gain to obtain target brightness.

The A/D converter 108 performs A/D conversion on the analog signal input from the analog processor 107 to generate digital image data (hereinafter referred to as "raw image data"), and outputs the image data to the volatile memory 112 via the bus 114. Alternatively, the A/D converter 108 may output the raw image data directly to respective components of the imaging device 10, which will be described later. Alternatively, the color filter 106, the analog processor 107, and the A/D converter 108 described above may be provided in the image sensor 105, and the image sensor 105 may directly output the digital raw image data.

The first operating unit 109 provides various instructions for the imaging device 10. Specifically, the first operating unit 109 has a power switch for switching power supply to the imaging device 10 on/off, a release switch for providing an instruction to capture a static image, an operation switch for switching various settings of the imaging device 10, a moving image switch for providing an instruction to capture a moving image, and the like.

The recording medium 111 is constituted by a memory card to be mounted on the imaging device 10 from outside, and is removably mounted on the imaging device 10 via the memory I/F unit 110. The recording medium 111 may also output programs and various kinds of information to the nonvolatile memory 113 via the memory I/F unit 110 under the control of the imaging control unit 115.

The volatile memory 112 temporarily stores image data output from the A/D converter 108 via the bus 114. For example, the volatile memory 112 temporarily stores image data sequentially output from the image sensor 105 for each frame via the analog processor 107, the A/D converter 108, and the bus 114. The volatile memory 112 is constituted by a synchronous dynamic random access memory (SDRAM) or the like.

The nonvolatile memory 113 stores various programs for operating the imaging device 10 and various data to be used in execution of the programs. In addition, the nonvolatile memory 113 includes a program recording unit 113a, and a correction factor recording unit 113b to record correction factors for correcting variation in spectral sensitivity of each of a plurality of pixels of the image sensor 105, which are input via the first external I/F unit 116. The nonvolatile memory 113 is constituted by a flash memory or the like.

The bus 114 is constituted by transmission paths and the like connecting the respective components of the imaging device 10, and transfers various data generated in the imaging device 10 to the respective components of the imaging device 10.

The imaging control unit 115 is constituted by a central processing unit (CPU) or the like, and generally controls the operation of the imaging device 10 by providing instructions, transferring data, and the like to the respective components constituting the imaging device 10 in response to instruction signals and release signals from the first operating unit 109. For example, when a second release signal is input from the first operating unit 109, the imaging control unit 115 performs control to start image capturing operation in the imaging device 10. The image capturing operation in the imaging device 10 refers to operation of performing predetermining processing by the analog processor 107 and the A/D converter 108 on an analog signal output by the image sensor 105. The thus processed image data are recorded in the recording medium 111 via the bus 114 and the memory I/F unit 110 under the control of the imaging control unit 115.

The first external I/F unit 116 outputs information input from external devices to the nonvolatile memory 113 or the volatile memory 112 via the bus 114, and outputs information stored in the volatile memory 112, information recorded on the nonvolatile memory 113, and image data generated by the image sensor 105 to external devices via the bus 114. Specifically, the first external I/F unit 116 outputs image data generated by the image sensor 105 to the first image processing apparatus 30 and the second image processing apparatus 40 via the bus 114.

Configuration of Light Source Device

Next, a configuration of the light source device 20 will be described. To calculate the correction factor, which will be described later, the light source device 20 emits parallel illumination light in a predetermined wavelength range as an object toward the imaging device 10 under the control of the first image processing apparatus 30. Specifically, the light source device 20 emits visible light in a range of 380 nm to 780 nm at 10-nm intervals toward the imaging device 10 under the control of the first image processing apparatus 30. The light source device 20 includes a rotating filter provided with a plurality of filters that transmit light of different wavelength ranges from one another, a light source such as a tungsten lamp or a xenon lamp, and a driver such as a motor that rotates the rotating filter, for example. Alternatively, the light source device 20 may include a fluorescent lamp, a light emitting diode (LED), laser light, or the like that emits parallel light in a predetermined wavelength range. Still alternatively, the light source device 20 may emit light toward the imaging device 10 by switching between light of red, green, and blue wavelength ranges instead of emission at 10-nm intervals. Furthermore, while the imaging device 10 is assumed to be a compact digital camera including the optical system 101 and the diaphragm 102 integrated with each other in the present embodiment, the imaging device 10 may also be applied to a digital camera with a lens unit including the optical system 101 and the diaphragm 102, which are removable from a main unit (body). In this case, light from the light source device 20 preferably enters the imaging device 10 as parallel light. Thus, in the case of a digital camera including a removable lens unit, images are preferably captured with the lens unit removed from the main unit. The light source device 20 preferably emits parallel light that is as uniform as possible toward the imaging device 10.

Configuration of First Image Processing Apparatus

Next, a configuration of the first image processing apparatus 30 will be described. The first image processing apparatus 30 includes a second external I/F unit 301, a light source control unit 302, a second operating unit 303, a first recording unit 304, a first image processing control unit 305, a first bus 306, and a correction factor calculating unit 307.

The second external I/F unit 301 acquires image data generated by the image sensor 105 via the first external I/F unit 116 of the imaging device 10, and outputs the acquired image data to the correction factor calculating unit 307 or a first buffer 304b. The second external I/F unit 301 also outputs information input from the correction factor calculating unit 307 to the imaging device 10. The second external I/F unit 301 and the first external I/F unit 116 are connected with each other via a control cable, a radio channel, or the like through which information can be exchanged bidirectionally.

The light source control unit 302 is constituted by a CPU, and controls the wavelength range of light emitted by the light source device 20. Specifically, the light source control unit 302 causes the light source device 20 to emit light in a wavelength range in units of 10 nm to the imaging device 10.

The second operating unit 303 provides various instructions for the first image processing apparatus 30. Specifically, the second operating unit 303 provides instructions to cause the light source device 20 to sequentially emit light of different wavelength ranges.

The first recording unit 304 is constituted by a volatile memory and a nonvolatile memory, and records image data input from the imaging device 10, various programs for operating the first image processing apparatus 30, and various data to be used in execution of the programs. The first recording unit 304 also includes a first program recording unit 304a that records various programs for operating the first image processing apparatus 30, and a first buffer 304b that temporarily stores image data and the like input from the imaging device 10.

The first image processing control unit 305 is constituted by a CPU or the like, and generally controls the operation of the first image processing apparatus 30 by providing instructions, transferring data, and the like to the respective components constituting the first image processing apparatus 30 in response to instructions from the second operating unit 303.

The correction factor calculating unit 307 calculates a correction factor for correcting a difference in the pixel value corresponding to a difference between the spectral sensitivity and a preset reference spectral sensitivity of a pixel of interest based on image data generated by the image sensor 105 for each of a plurality of pixels of the image sensor 105, and records the calculation result in the correction factor recording unit 113b of the imaging device 10.

The first bus 306 is constituted by transmission paths and the like connecting the respective components of the first image processing apparatus 30, and transfers various data generated in the first image processing apparatus 30 to the respective components of the first image processing apparatus 30.

Configuration of Second Image Processing Apparatus

Next, a configuration of the second image processing apparatus 40 will be described.

The second image processing apparatus 40 includes a third external I/F unit 401, a second recording unit 402, a second bus 403, a correction amount calculating unit 404, a pixel value correcting unit 405, and an image processor 406.

The third external I/F unit 401 acquires image data generated by the image sensor 105 and correction factors from the correction factor recording unit 113b via the first external I/F unit 116 of the imaging device 10, and outputs the acquired image data and correction factors to the correction amount calculating unit 404 or a second buffer 402b. The third external I/F unit 401 and the first external I/F unit 116 are connected with each other via a control cable, a radio channel, or the like through which information can be exchanged bidirectionally.

The second recording unit 402 is constituted by a volatile memory and a nonvolatile memory, and records image data and correction factors input from the imaging device 10, various programs for operating the second image processing apparatus 40, and various data to be used in execution of the programs. The second recording unit 402 also includes a second program recording unit 402a for driving the second image processing apparatus 40 and the second buffer 402b that temporarily stores image data, a correction factor of a pixel of interest, and the like input from the imaging device 10.

The correction amount calculating unit 404 calculates a correction amount for correcting the pixel value of a pixel of interest based on the correction factor for the pixel of interest recorded in the correction factor recording unit 113b and pixel values of surrounding pixels of the pixel of interest. The correction amount calculating unit 404 also calculates a correction amount for correcting the pixel value of a pixel of interest based on the pixel values of the pixel of interest and surrounding pixels. The surrounding pixels refer to pixels adjacent to the pixel of interest and pixels located near the pixel of interest. In addition, the pixels adjacent to the pixel of interest refer to pixels located next to the pixel of interest in the horizontal and vertical directions. Furthermore, the pixels located near the pixel of interest refer to pixels next to the pixel of interest in the diagonal direction or pixels located closest to the pixel of interest of pixels having the same color as the pixel of interest. Furthermore, the correction amount calculating unit 404 selects and acquires a correction factor depending on the light source from the correction factor recording unit 113b, and calculates a correction amount for correcting the pixel value of a pixel of interest by using the acquired correction factor.

The pixel value correcting unit 405 corrects the pixel value of the pixel of interest by using the correction amount calculated by the correction amount calculating unit 404.

The image processor 406 performs predetermined image processing on image data where the variation in spectral sensitivity is corrected by the pixel value correcting unit 405, and outputs the resulting image data to the display device 50. The predetermined image processing refers to basic image processing including optical black subtraction, white balance adjustment, synchronization of image data when the image sensor 105 has a Bayer array, color matrix computation, γ correction, color reproduction, edge enhancement, noise reduction, and the like. The image processor 406 also performs image processing for reproducing a natural image based on preset parameters for image processing. The parameters for image processing refer to values of contrast, sharpness, saturation, white balance, and gradation. Image data subjected to the predetermined image processing may be recorded in the nonvolatile memory 113 or the recording medium 111 via the third external I/F unit 401.

Configuration of Display Device

Next, a configuration of the display device 50 will be described. The display device 50 displays an image corresponding to image data input from the second image processing apparatus 40. The display device 50 includes a display panel of liquid crystal, organic electro-luminescence (EL), or the like.

In the imaging system 1 having the above-described configuration, the first image processing apparatus 30 calculates a correction factor for correcting a difference in the pixel value due to a difference between the spectral sensitivity of each of the pixels of the image sensor 105 and the reference spectral sensitivity, the second image processing apparatus 40 calculates a correction amount for correcting the pixel value of a pixel of interest by using the correction factor calculated by the first image processing apparatus 30, and corrects the pixel value of the pixel of interest by using the calculated correction amount, and the display device 50 displays an image corresponding to the image data subjected to image processing by the second image processing apparatus 40.

Outline of Spectral Sensitivity Characteristics

Figure 4:
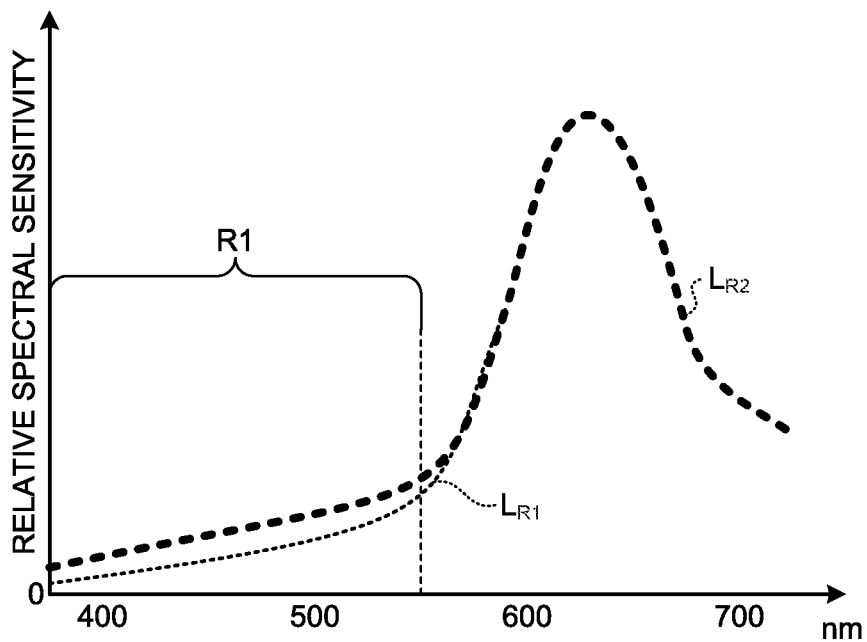
FIG. 4 is a graph illustrating spectral sensitivity characteristics of R pixels of the image sensor according to the first embodiment of the present invention.
Figure 5:
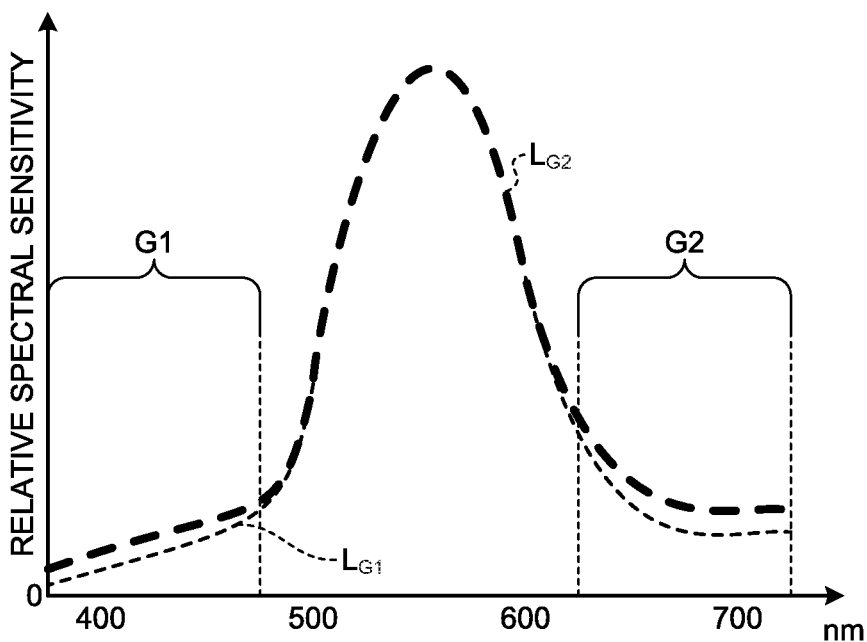
FIG. 5 is a graph illustrating spectral sensitivity characteristics of G pixels of the image sensor according to the first embodiment of the present invention.
Figure 6:
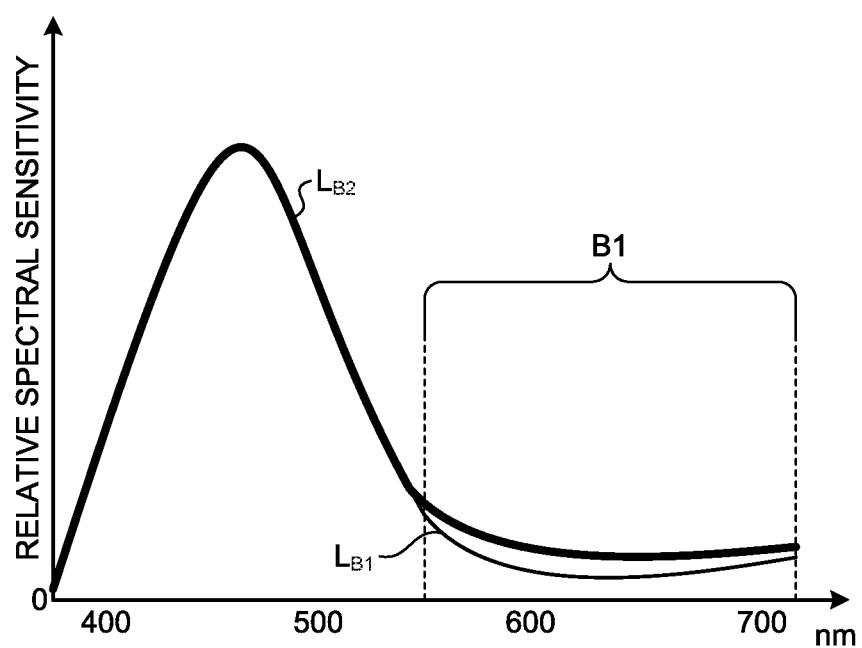
FIG. 6 is a graph illustrating spectral sensitivity characteristics of B pixels of the image sensor according to the first embodiment of the present invention.

Next, the respective spectral sensitivity characteristics of R pixels, G pixels, and B pixels constituting the image sensor 105 will be described. FIG. 3 is a graph illustrating an example of averages of the spectral sensitivity characteristics of R pixels, G pixels, and B pixels constituting the image sensor 105. FIG. 4 is a graph illustrating an example of the spectral sensitivity characteristics of R pixels. FIG. 5 is a graph illustrating an example of the spectral sensitivity characteristics of G pixels. FIG. 6 is a graph illustrating an example of the spectral sensitivity characteristics of B pixels. In FIGS. 3 to 6, the horizontal axis represents wavelength, and the vertical axis represents relative spectral sensitivity. In FIGS. 3 to 6, a curve $L_{B1}$ represents an average spectral sensitivity characteristic obtained by averaging the spectral sensitivities of a plurality of B pixels, a curve $L_{G1}$ represents an average spectral sensitivity characteristic obtained by averaging the spectral sensitivities of a plurality of G pixels, and a curve $L_{R1}$ represents an average spectral sensitivity characteristic obtained by averaging the spectral sensitivities of a plurality of R pixels. In addition, a curve $L_{R2}$ in FIG. 4 represents an example of the spectral sensitivity characteristics of R pixels, a curve $L_{G2}$ in FIG. 5 represents an example of the spectral sensitivity characteristics of G pixels, and a curve $L_{B2}$ in FIG. 6 represents an example of the spectral sensitivity characteristics of B pixels. In FIGS. 4 to 6, a difference in spectral sensitivity refers to a difference between the average spectral sensitivity and the spectral sensitivity of each pixel, which is caused by variation in spectral transmittance due to variation in thickness of filters during manufacture of the image sensor 105 or the like, variation in spectral reflectance or spectral absorptance due to a difference in circuit pattern or circuit characteristic among pixels, or the like. All the pixels of the image sensor 105 may be used for calculation of the respective average spectral sensitivity characteristics of R pixels, G pixels, and B pixels, or a pixel of interest and neighboring pixels of the same color may be used for calculation of the average spectral sensitivity characteristic for the pixel of interest (that is, a local average spectral sensitivity characteristic). Alternatively, neighboring pixels of the same color as a pixel of interest, without the pixel of interest, may be used for calculation of the average spectral sensitivity characteristic for the pixel of interest. In a case where light emitted to the image sensor 105 is not uniform due to nonuniform light from the light source device 20, shading caused by the optical system 101, or the like, the calculation of the average spectral sensitivity characteristic for a pixel of interest allows an average spectral sensitivity characteristic that is not affected by the nonuniform light to be obtained. The average spectral sensitivity characteristics correspond to reference spectral sensitivity characteristics in the present embodiment.

As illustrated in FIGS. 4 to 6, the difference in spectral sensitivity varies depending on the wavelength range. In a specific example, in a case of R pixels, as illustrated by the curve $L_{R1}$ and the curve $L_{R2}$ in FIG. 4, the difference from the average spectral sensitivity occurs in a wavelength range R1 shorter than about 550 nm. In a case of G pixels, as illustrated by the curve $L_{G1}$ and the curve $L_{G2}$ in FIG. 5, the difference from the average spectral sensitivity occurs in a wavelength region G1 shorter than about 500 nm and in a wavelength region G2 longer than about 600 nm. Furthermore, in a case of B pixels, as illustrated by the curve $L_{G1}$ and the curve $L_{G2}$ in FIG. 6, the difference from the average spectral sensitivity occurs in a wavelength range B1 longer than about 550 nm.

While the examples of R pixels, G pixels, and B pixels having spectral sensitivities higher than the average spectral sensitivities in the wavelength ranges of low spectral sensitivities have been explained in FIGS. 4 to 6, any of the following pixels (a) to (d) can be present depending on the pixels of the image sensor 105:

(a) pixels having spectral sensitivities lower than or equal to the average spectral sensitivity in a range of low spectral sensitivities;

(b) pixels having spectral sensitivities higher than, lower than, or equal to the average spectral sensitivity in a wavelength range of high spectral sensitivities;

(c) pixels having spectral sensitivities where the relation between the spectral sensitivities and the average sensitivity changes or does not change between a wavelength range of low spectral sensitivities and a wavelength range of high spectral sensitivities; and (d) pixels having spectral sensitivities where the relation between the spectral sensitivities and the average sensitivities changes depending on the wavelength whether the spectral sensitivities are high or low.

As described above, in the image sensor 105, variation in spectral sensitivity occurs in each pixel due to variation in thickness of the color filters or the like during manufacture. In the present embodiment, as an example, the change in the variation in spectral sensitivity depending on the wavelength is small, and the variation is substantially equally small at any wavelength. In this case, in capturing a flat red object, for example, since R pixels are in a wavelength range of high spectral sensitivities, variation in pixel value due to random noise is dominant and the variation in spectral sensitivity has little influence on the image quality.

In contrast, in capturing a flat red object, since G pixels and B pixels are in wavelength ranges of low spectral sensitivities, variation in pixel value due to random noise is small, and variation in pixel value due to the variation in spectral sensitivity is relatively large, which thus has influence on the image quality. Such variation in pixel value due to the variation in spectral sensitivity particularly appears as roughness of the image of the flat object. Since the roughness is dependent on the pixel values of the pixels, the roughness will appear to be still even when the object having small irregularity moves, which appears strange. It is therefore preferable to place priority to correction in a wavelength range of spectral sensitivities lower than those of pixels of the other colors.

Figure 7:
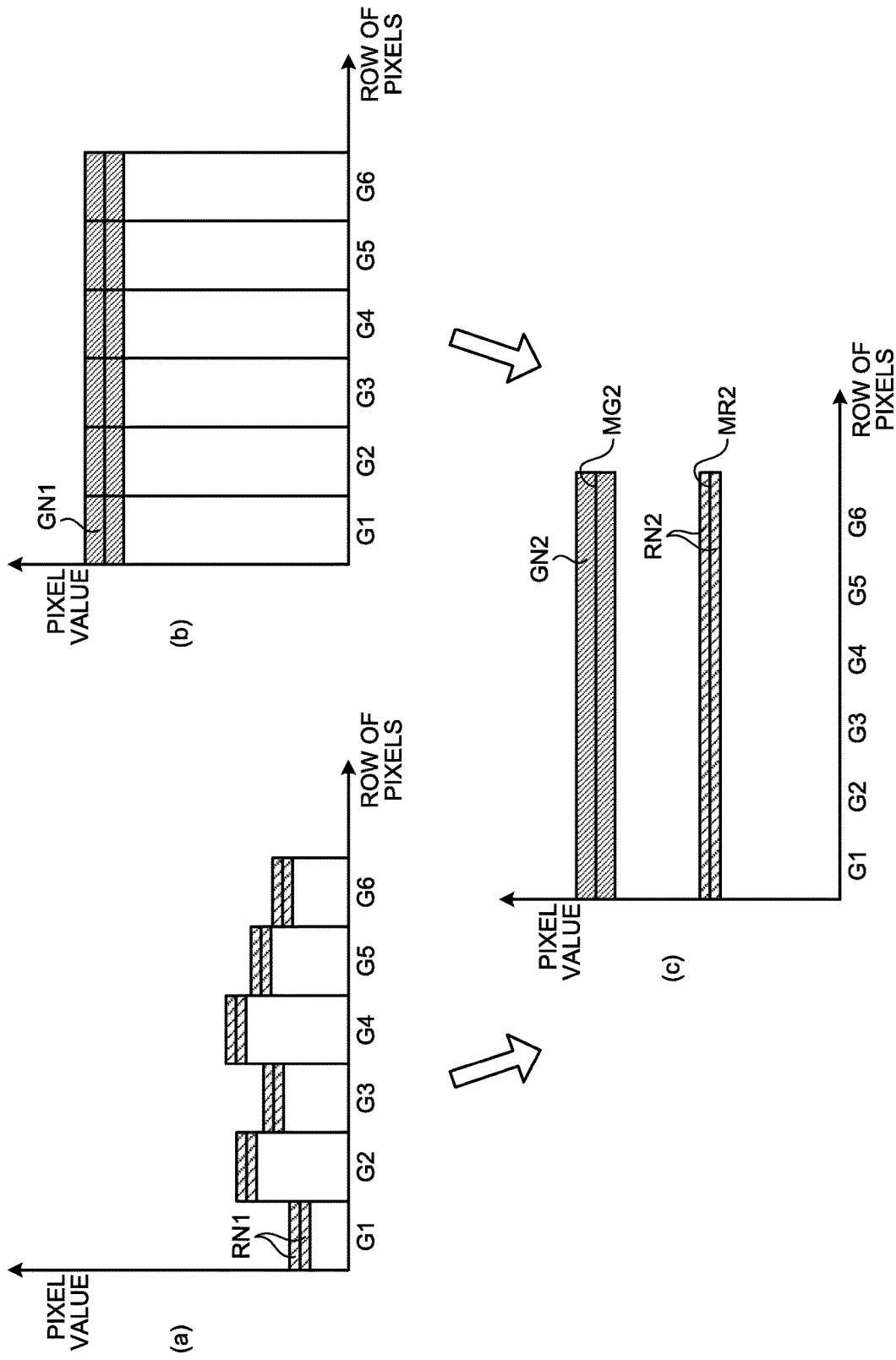
FIG. 7 depicts graphs schematically illustrating pixel values of a plurality of G pixels of the image sensor when the image sensor according to the first embodiment of the present invention captures images of a flat red object or a flat green object.

FIG. 7 depicts graphs schematically illustrating the pixel values of a plurality of G pixels of the image sensor 105 when the image sensor 105 captures images of a flat red object or a flat green object. In FIG. 7, the horizontal axis represents row of pixels, and the vertical axis represents pixel value. In addition, in FIG. 7, a line MR2 represents the average value of pixel values of the G pixels when an image of a flat red object is captured, and a line MG2 represents the average value of pixel values of the G pixels when an image of a flat green object is captured. In FIG. 7, random noise RN1, RN2, GN1, and GN2 occurring in the G pixels is expressed by hatching. Furthermore, in FIG. 7, an example of six G pixels among R pixels, G pixels, and B pixels constituting the image sensor 105 will be described.

As illustrated in FIG. 7, when the image sensor 105 has captured an image of a flat red object, since G pixels G1 to G6 are in a wavelength range of low spectral sensitivities, the pixel values of the G pixels G1 to G6 are more affected by variation in thickness of the color filters caused during manufacture or the like than the random noise, and thus vary widely (see (a) of FIG. 7). In contrast, when the image sensor 105 has captured an image of a flat green object, since G pixels G1 to G6 are in a wavelength range of high spectral sensitivities, the variation in pixel value due to random noise is more dominant than the variation in spectral sensitivity due to variation in thickness of the color filters caused during manufacture or the like, and the pixel values of G pixels G1 to G6 are substantially constant (see (b) of FIG. 7). Thus, the roughness may appear or may not appear depending on the spectral characteristics of the object. Since the variation in spectral sensitivity of the pixels differs depending on the pixels as described above, the variation described above cannot be corrected by applying an equal gain to the pixels or adding or subtracting an equal offset to or from the pixels as in the related art. Thus, in the present embodiment, correction factors are calculated and correction is performed as will be described below, so that the aforementioned roughness can be reduced and that the pixel values can be corrected to those represented by MR2 when the object is flat (see (c) of FIG. 7). In the present embodiment, degradation in image quality caused by differences in spectral sensitivity of a plurality of pixels of the image sensor 105 is thus prevented, which allows an image of high quality to be obtained.

Figure 8:
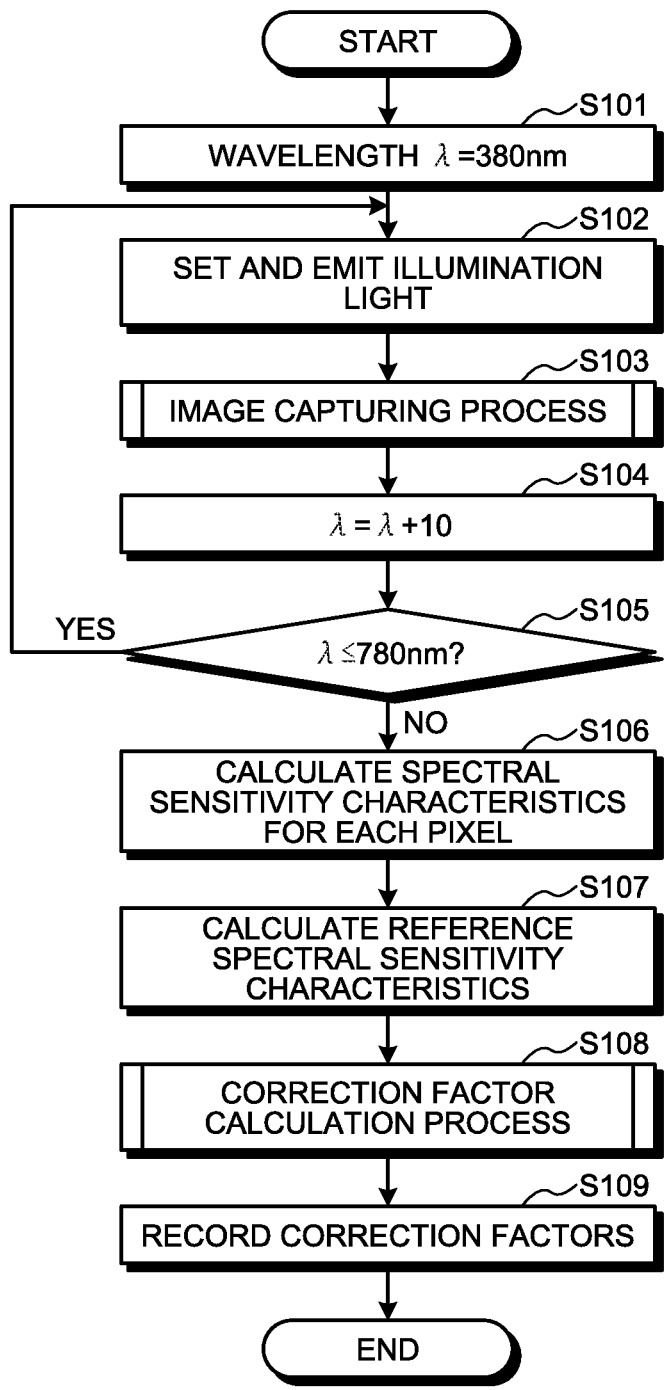
FIG. 8 is a flowchart illustrating an outline of processing performed by a first image processing apparatus according to the first embodiment of the present invention.

Processing of First Image Processing Apparatus Next, processing performed by the first image processing apparatus 30 will be described. FIG. 8 is a flowchart illustrating an outline of the processing performed by the first image processing apparatus 30, and illustrates a main routine. In FIG. 8, processing for calculating correction factors for correcting variation in spectral sensitivity of pixels performed by the first image processing apparatus 30 will be described. In the present embodiment, since the pixels of the image sensor 105 have any of the filters R, G, and B of the color filter 106, a correction factor for correction using R pixel values, a correction factor for correction using G pixel values, and a correction factor for correction using B pixel values are calculated for the pixels. Of course, some of the correction factors may be calculated.

As illustrated in FIG. 8, the light source control unit 302 sets λ representing a wavelength range emitted by the light source device 20 to 380 nm (step S101). While the light source control unit 302 sets 380 to 780 nm as a visible light wavelength range in the present embodiment, the wavelength range is not limited thereto and may be another wavelength range such as that of infrared light or the like.

Subsequently, the light source control unit 302 sets the wavelength of illumination light to be emitted by the light source device 20 to the wavelength λ, and causes the light source device 20 to emit illumination light (step S102). As a result, the light source device 20 emits single-wavelength flat illumination light having the wavelength λ as an object toward the imaging device 10.

Thereafter, the first image processing control unit 305 causes the imaging device 10 to perform an image capturing process of capturing the illumination light emitted by the light source device 20 a predetermined number of times and calculating average values of the pixel values of the pixels of the image sensor 105 (step S103).

Figure 9:
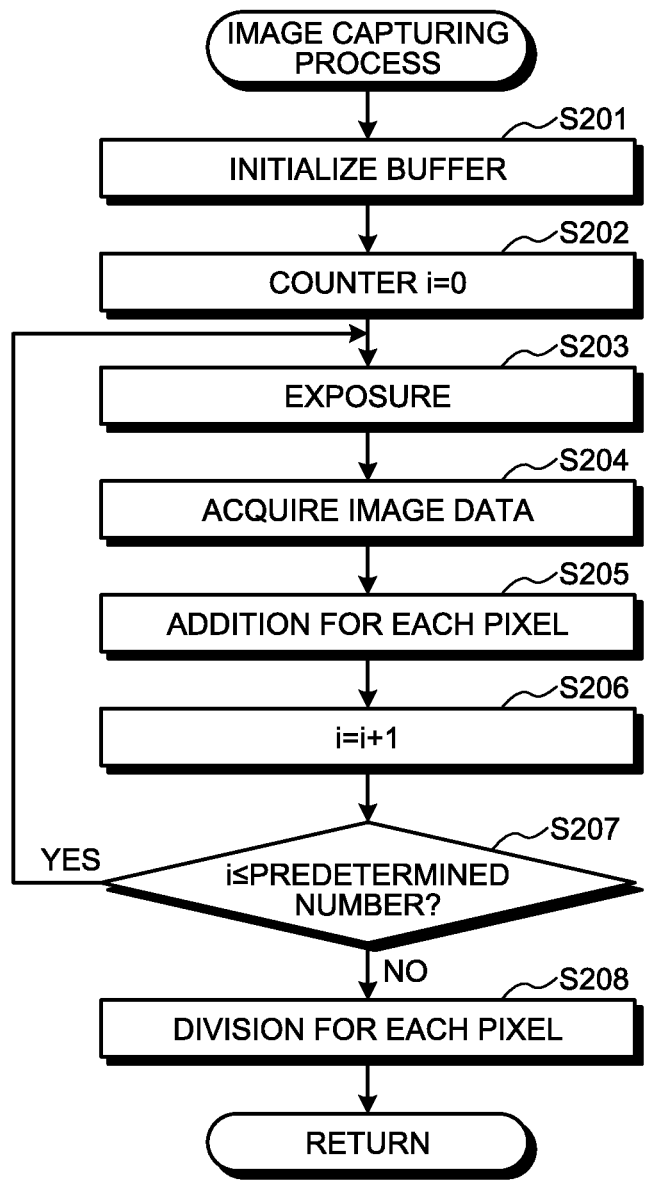
FIG. 9 is a flowchart illustrating an outline of an image capturing process in FIG. 8.

FIG. 9 is a flowchart illustrating an outline of the image capturing process in step S103 of FIG. 8. As illustrated in FIG. 9, the first image processing control unit 305 initializes a buffer area for calculating accumulated values of pixel values of pixels corresponding to image data generated by the image sensor 105 and stored in the first buffer 304*b* of the first recording unit 304 (step S201).

Subsequently, the first image processing control unit 305 sets a counter i to 0 (step S202), causes the image sensor 105 to start exposure (start capturing an image of the illumination light emitted by the light source device 20) via the first bus 306, the second external I/F unit 301, the first external I/F unit 116, and the bus 114 (step S203), and acquires the image data from the image sensor 105 (step S204).

Thereafter, the first image processing control unit 305 adds the pixel values of the pixels stored in the first buffer 304*b* and the pixel values of the pixels of the latest image data acquired from the image sensor 105, and replaces the pixel values stored in the first buffer 304*b* by the resulting pixel values (step S205).

Subsequently, the first image processing control unit 305 increments the counter i (i=i+1) (step S206), and if the number (i) of the acquired image data is smaller than a predetermined number (e.g., 100) (step S207: Yes), the first image processing apparatus 30 returns to step S203. In contrast, if the number (i) of the acquired image data is not smaller than the predetermined number (step S207: No), the first image processing apparatus 30 proceeds to step S208.

Thereafter, the first image processing control unit 305 divides the pixel values of the pixels stored in the first buffer 304b by the number of the acquired image data (e.g., 100), and replaces the pixel values of the pixels stored in the first buffer 304b by the division results (step S208). As a result, the pixel values of the pixels stored in the first buffer 304b are average pixel values. If a defective pixel is included in the pixels of the image data acquired from the image sensor 105, the first image processing control unit 305 may correct the defective pixel. After step S208, the first image processing apparatus 30 returns to the main routing of FIG. 8 described above. While the average pixel values are calculated in the image capturing process in FIG. 9, it is sufficient if image data from which at least temporarily fluctuating noise such as flickering defects of random noise or RTS noise is removed can be obtained. Thus, a known noise reduction method or the like may be used to obtain image data in which temporarily fluctuating noise is reduced.

Referring back to FIG. 8, the description of step S104 and subsequent steps will be provided.

In step S104, the light source control unit 302 sets the wavelength of the illumination light to be emitted by the light source device 20 by adding 10 nm to the wavelength λ. Alternatively, the light source control unit 302 may use intervals other than 10 nm, such as intervals of 1 nm or 5 nm, for example. Needless to say, the light source control unit 302 may use intervals of 20 nm or 50 nm. Still alternatively, the light source control unit 302 may use intervals of three wavelength ranges of red, green, and blue, for example.

Subsequently, if the wavelength λ of the illumination light emitted by the light source device 20 is equal to or smaller than 780 nm (λ≤780 nm) (step S105: Yes), the first image processing apparatus 30 returns to step S102. In contrast, if the wavelength λ of the illumination light emitted by the light source device 20 is not equal to or smaller than 780 nm (λ≤780 nm) (step S105: No), the first image processing apparatus 30 proceeds to step S106.

Thereafter, the correction factor calculating unit 307 uses image data obtained by capturing the object (the illumination light emitted by the light source device 20) in a range from 380 to 780 nm stored in the first buffer 304b to calculate the spectral sensitivity characteristics for each of the pixels (step S106). In this process, if the radiance of light in the range from 380 to 780 nm is not constant, the correction factor calculating unit 307 performs normalization before calculating the spectral sensitivity characteristics for each of the pixels.

Subsequently, the correction factor calculating unit 307 calculates the reference spectral sensitivity characteristics for the respective color filters of red, green, and blue, by using the image data obtained by capturing the object (the illumination light emitted by the light source device 20) in the range from 380 to 780 nm stored in the first buffer 304b (step S107). Specifically, the correction factor calculating unit 307 uses a plurality of image data obtained by capturing the object (the illumination light emitted by the light source device 20) in the range from 380 to 780 nm stored in the first buffer 304b to calculate any one of an average value, a maximum value, a minimum value, a median, a mode, and the like of the spectral sensitivity characteristics for each of the color filters of red, green, and blue by a statistical technique as the reference spectral sensitivity characteristic. In the description of the present embodiment, the average values of the spectral sensitivity characteristics of the respective color filters of red, green, and blue are the reference spectral sensitivity characteristics. In addition, if uniform light is not emitted to the image sensor 105 in such a case where the object is not completely flat, in such a case where shading is caused by the optical system 101, or the like, the correction factor calculating unit 307 may calculate the reference spectral sensitivity for each pixel of interest by using the spectral sensitivity characteristics of surrounding pixels of the same color as the pixel of interest.

Thereafter, the correction factor calculating unit 307 performs a correction factor calculation process of calculating a correction factor for correcting the spectral sensitivity characteristics for each of the pixels of the image sensor 105 (step S108).

Figure 10:
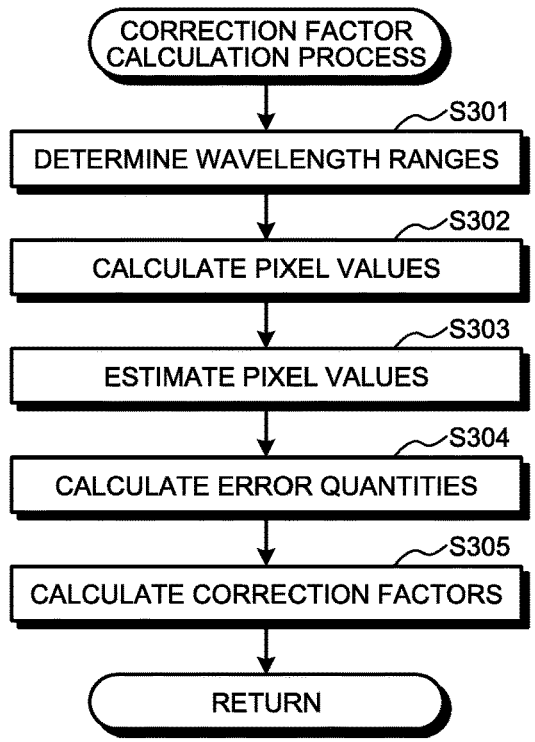
FIG. 10 is a flowchart illustrating an outline of a correction factor calculation process in FIG. 8.

FIG. 10 is a flowchart illustrating an outline of the correction factor calculation process in step S108 of FIG. 8.

Figure 11:
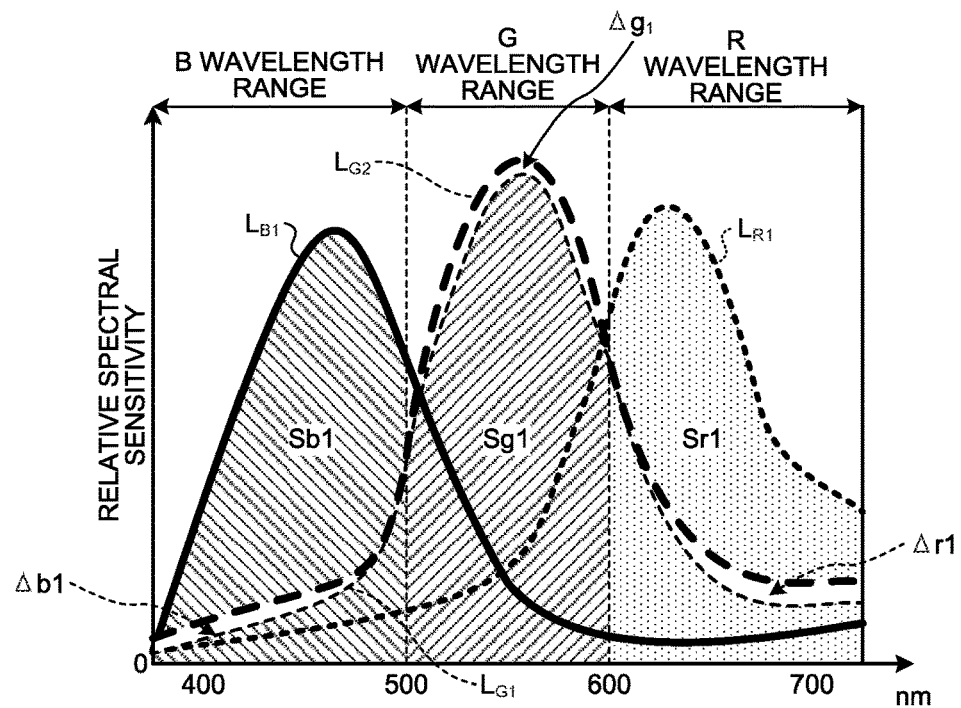
FIG. 11 is a graph schematically illustrating spectral characteristics in calculation of correction factors in a case where normal light is used.

As illustrated in FIG. 10, the correction factor calculating unit 307 determines wavelength ranges of the respective colors based on the reference spectral sensitivity characteristics (step S301). Specifically, as illustrated in FIG. 11, the correction factor calculating unit 307 determines a B wavelength range of the filters B, a G wavelength range of the filters G, and an R wavelength range of the filters R based on the reference spectral sensitivity characteristics. For example, in the case illustrated in FIG. 11, the correction factor calculating unit 307 determines the B wavelength range to be from 380 to 500 nm, the G wavelength range to be from 500 to 600 nm, and the R wavelength range to be from 600 to 780 nm. Alternatively, the correction factor calculating unit 307 may determines the wavelength ranges such that the B wavelength range, the G wavelength range, and the R wavelength range partially overlap with one another. Conversely, the correction factor calculating unit 307 may determine the wavelength ranges such that a range between the wavelength ranges is included in neither of the wavelength ranges. In addition, the wavelength ranges of the respective colors may be determined in advance based on designed values of the spectral sensitivity characteristics or the like.

Subsequently, the correction factor calculating unit 307 calculates the pixel values of the pixels based on the spectral sensitivity characteristics of the pixels (step S302). Specifically, the correction factor calculating unit 307 calculates an accumulated value of the spectral sensitivity characteristics of pixels in the wavelength range of the same color as each pixel, and obtains the value as a pixel value. The pixel value corresponds to a pixel value in a chase where an object (illumination light) having a rectangular spectral characteristic in which only the characteristics of the wavelength range of the same color are 1 and the characteristics of other wavelength ranges are 0 is exposed. In a case where a possible object (a wavelength range of a light source or illumination light) can be limited or identified in advance, the correction factor calculating unit 307 may obtain a value corresponding to the pixel value at exposure of the object by weighted addition depending on the spectral characteristic of the object.

Thereafter, the correction factor calculating unit 307 estimates different-color pixel values of colors different from that of a pixel of interest by interpolation using pixel values of pixels being surrounding pixels of the pixel of interest and being of different colors having filters of colors different from that of the filter of the pixel of interest (step S303). Specifically, when a pixel of interest is a G pixel, the correction factor calculating unit 307 calculates the pixel values in the R wavelength range and in the B wavelength range of different colors. In addition, in step S303, the correction factor calculating unit 307 estimates an average pixel value of the same color as a pixel of interest by interpolation using neighboring pixel values having filters of the same color as the filter of the pixel of interest. Specifically, when a pixel of interest is a G pixel, the correction factor calculating unit 307 calculates an average pixel value of the G wavelength range.

Figure 12:
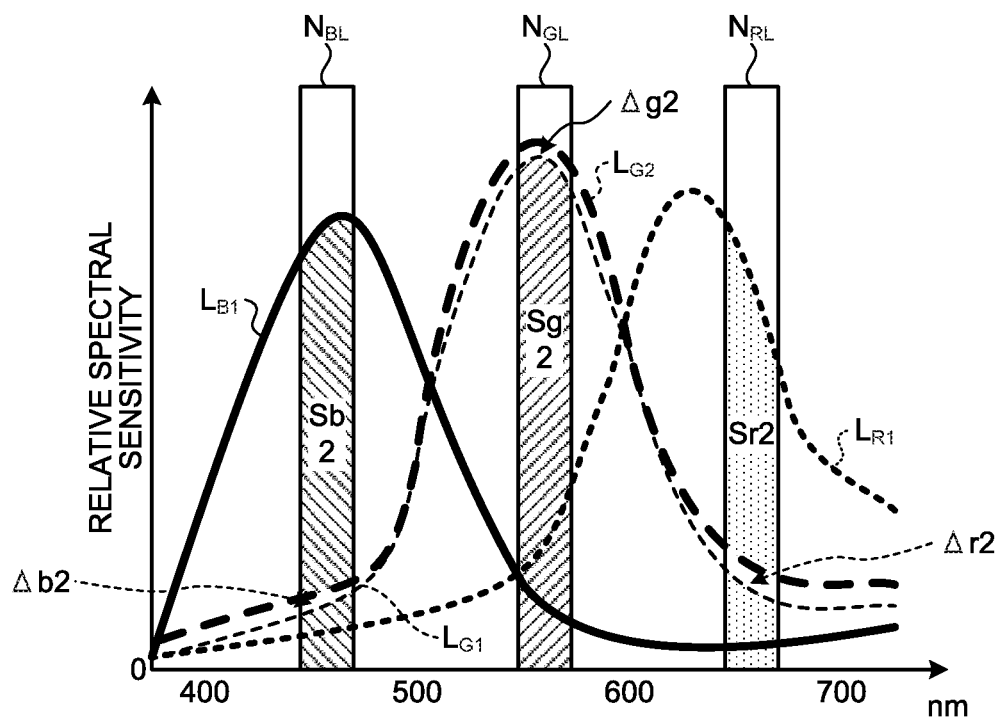
FIG. 12 is a graph schematically illustrating spectral characteristics in calculation of correction factors in a case where narrow-band light is used.

FIG. 11 is a graph schematically illustrating the spectral characteristics in calculation of correction factors in a case where normal light is used. FIG. 12 is a graph schematically illustrating the spectral characteristics in calculation of correction factors in a case where narrow-band light is used. In FIGS. 11 and 12, the horizontal axis represents wavelength, and the vertical axis represents relative spectral sensitivity. The normal light refers to light of visible light emitted by the light source such as a tungsten lamp or a xenon lamp or light of natural light such as sunlight, whose spectral characteristics change continuously. Narrow-band light refers to light emitted by a light source such as a fluorescent lamp, a light emitting diode (LED) lamp, a laser light source, or a light source having a filter transmitting a certain wavelength range, and having a discrete spectral characteristic. Light having a discrete spectral characteristic includes light having a high intensity in one wavelength range and a significantly low intensity in other wavelength ranges.

As illustrated in FIG. 11, in a case where normal light (light other than narrow-band light) is used in image capturing, when a pixel of interest is a G pixel, the correction factor calculating unit 307 estimates different-color pixel values of colors different from the pixel of interest and an average pixel value of the same color as the pixel of interest by calculating a pixel value Sr1 in the R wavelength range and a pixel value Sb1 in the B wavelength range, which are of colors different from that of the pixel of interest, and an average pixel value Sg1 of the G wavelength range of the same color as that of the pixel of interest. In addition, as illustrated in FIG. 12, in a case where narrow-band light is used in capturing an image, when a pixel of interest is a G pixel, the correction factor calculating unit 307 estimates different-color pixel values of colors different from the pixel of interest and an average pixel value of the same color as the pixel of interest by calculating a pixel value Sr2 in the R wavelength range and a pixel value Sb2 in the B wavelength range, which are of different colors, and an average pixel value Sg2 of the G wavelength range of the same color as that of the pixel of interest. Under the circumstances illustrated in FIG. 12, the correction factor calculating unit 307 sets the widths of the R wavelength range, the G wavelength range and the B wavelength range to be small according to the major wavelength ranges of the used narrow-band light. Specifically, in the case illustrated in FIG. 12, the widths are set to narrow-band light $N_{RL}$, narrow-band light $N_{GL}$, and narrow-band light $N_{BL}$. In FIGS. 11 and 12, the correction factor calculating unit 307 preferably use the same interpolation methods as those used in a correction amount calculation process performed by the second image processing apparatus 40, which will be described later, for the pixel value Sb1, the pixel value Sb2, the pixel value Sr1, and the pixel value Sr2. Similarly, the calculation methods for the average pixel value Sg1 and the average pixel value Sg2 are preferably the same as the interpolation methods used in the correction amount calculation process performed by the second image processing apparatus 40, which will be described later. Thus, the interpolation methods for the pixel value Sb1, the pixel value Sb2, the pixel value Sg1, the pixel value Sg2, the pixel value Sr1, and the pixel value Sr2 will be described later.

Subsequently, the correction factor calculating unit 307 calculates, for each pixel, error quantities in the wavelength ranges of the colors different from that of the pixel (step S304). Specifically, in the case illustrated in FIG. 11, the correction factor calculating unit 307 calculates, for each pixel, a difference between the spectral sensitivity characteristic and the reference spectral sensitivity characteristic by accumulated values in the respective wavelength ranges. For example, as represented by the curve $L_{G1}$ and the curve $L_{G2}$ in FIG. 11, when the pixel of interest is a G pixel, the correction factor calculating unit 307 calculates values obtained by accumulating differences between the curve $L_{G2}$ and the curve $L_{G1}$ in the R wavelength range, the G wavelength range, and the B wavelength range as an error quantity $\Delta r1$, an error quantity $\Delta g1$, and an error quantity $\Delta b1$, respectively. In the case of narrow-band light, as represented by the curve $L_{G1}$ and the curve $L_{G2}$ in FIG. 12, when the pixel of interest is a G pixel, the correction factor calculating unit 307 calculates values obtained by accumulating differences between the curve $L_{G1}$ and the curve $L_{G2}$ in the R wavelength range, the G wavelength range, and the B wavelength range as an error quantity $\Delta r2$, an error quantity $\Delta g2$, and an error quantity $\Delta b2$, respectively. An error quantity has a positive value if the spectral sensitivity characteristic is larger (higher) than the reference spectral sensitivity characteristic, and has a negative value if the spectral sensitivity characteristic is smaller (lower) than the reference spectral sensitivity characteristic.

Thereafter, the correction factor calculating unit 307 calculates, for each pixel, a correction factor for the pixel by dividing the error quantity by the estimated different-color pixel value or average pixel value (step S305). For example, in the case illustrated in FIG. 11, when the pixel of interest is a G pixel, the correction factor calculating unit 307 divides the error quantity in the R wavelength range calculated in step S304 described above by the pixel value in the R wavelength range estimated in step S303 described above to obtain a correction factor ($\Delta r1/Sr1$) for the R component, divides the error quantity in the G wavelength range calculated in step S304 described above by the average pixel value in the G wavelength range estimated in step S303 described above to obtain a correction factor ($\Delta g1/Sg1$) for the G component, and divides the error quantity in the B wavelength range calculated in step S304 described above by the pixel value in the B wavelength range estimated in step S303 described above to obtain a correction factor ($\Delta b1/Sb1$) for the B component. In the case illustrated in FIG. 12, when the pixel of interest is a G pixel, the correction factor calculating unit 307 divides the error quantity in the R wavelength range calculated in step S304 described above by the pixel value in the R wavelength range estimated in step S303 described above to obtain a correction factor ($\Delta r2/Sr2$) for the R component, divides the error quantity in the G wavelength range calculated in step S304 described above by the average pixel value in the G wavelength range estimated in step S303 described above to obtain a correction factor ($\Delta g2/Sg2$) for the G component, and divides the error quantity in the B wavelength range calculated in step S304 described above by the pixel value in the B wavelength range estimated in step S303 described above to obtain a correction factor ($\Delta b2/Sb2$) for the B component. Furthermore, the correction factor calculating unit 307 similarly calculates a correction factor for each of the pixels of other colors, such as R pixels and B pixels, for example. After step S305, a first image processing apparatus 300 returns to the main routine of FIG. 8.

Referring back to FIG. 8, the description of step S109 and subsequent steps will be provided.

In step S109, the correction factor calculating unit 307 records, for each of the pixels of the image sensor 105, the calculated correction factor as a correction factor for the pixel in the correction factor recording unit 113b of the imaging device 10. For capturing an image in a dark place or the like in particular, light is emitted by a light emitting unit, which is not illustrated in FIG. 1, to an object in addition to natural light such as sunlight, so that the image sensor 105 captures the reflective light thereof. The spectral sensitivity variation may be different in the degree of variation depending on the wavelength. Thus, the correction factor calculating unit 307 preferably performs correction adapted to light emitted by the light emitting unit (light emitted to the object). In particular, as the wavelength range of emitted light is smaller, the degree of variation of natural light or the like is more likely to differ from that of normal light. The correction factor calculating unit 307 thus records correction factors depending on the types of light sources used in capturing an image in the correction factor recording unit 113b. Specifically, the correction factor calculating unit 307 records the types of light sources used in capturing an image and the correction factors in association with one another in the correction factor recording unit 113b. For example, the correction factor calculating unit 307 records information indicating normal light and correction factors calculated as in FIG. 11 described above in association with each other in the correction factor recording unit 113b. The correction factor calculating unit 307 also records information indicating narrow-band light and correction factors calculated as in FIG. 12 described above in association with each other in the correction factor recording unit 113b. In this manner, correction factors for the pixels associated with each of a plurality of light sources can be recorded. After step S109, the first image processing apparatus 30 terminates the processing.

As described above, the first image processing apparatus 30 calculates, for each pixel, a correction factor for correcting a difference between the spectral sensitivity of a pixel of interest and a preset reference spectral sensitivity by a difference between pixel values in image data generated by the image sensor 105 having a plurality of pixels and a plurality of color filters having different spectral transmittances arranged on the light receiving surfaces of the pixels in a predetermined pattern based on the image data. This allows a correction factor for correcting variation in spectral sensitivity of each of a plurality of pixels of the image sensor 105 to be calculated for each of the pixels.

Processing of Second Image Processing Apparatus

Figure 13:
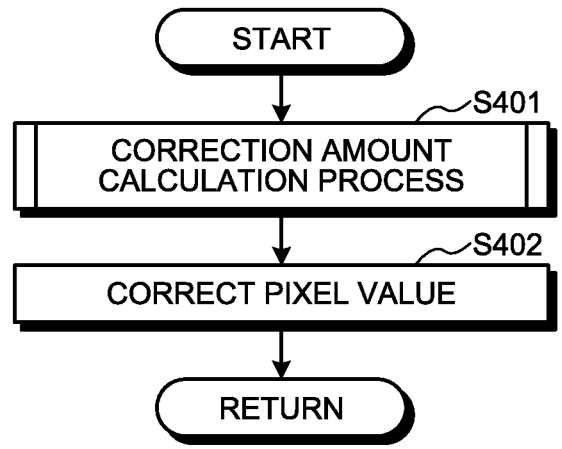
FIG. 13 is a flowchart illustrating an outline of processing performed by a second image processing apparatus according to the first embodiment of the present invention.

Next, processing performed by the second image processing apparatus 40 will be described. FIG. 13 is a flowchart illustrating an outline of the processing performed by the second image processing apparatus 40, and illustrates a main routine.

As illustrated in FIG. 13, the correction amount calculating unit 404 first acquires the image data generated by the image sensor 105 and the correction factors recorded in the correction factor recording unit 113b from the imaging device 10, and performs the correction amount calculation process of calculating the correction amounts for the pixel values of pixel of interests in the acquired image data (step S401). An outline of the correction amount calculation process will be described later.

Subsequently, the pixel value correcting unit 405 corrects the pixel values of the pixels by subtracting the correction amounts for the pixels calculated by the correction amount calculating unit 404 (step S402). After step S402, the second image processing apparatus 40 terminates the processing.

Figure 14:
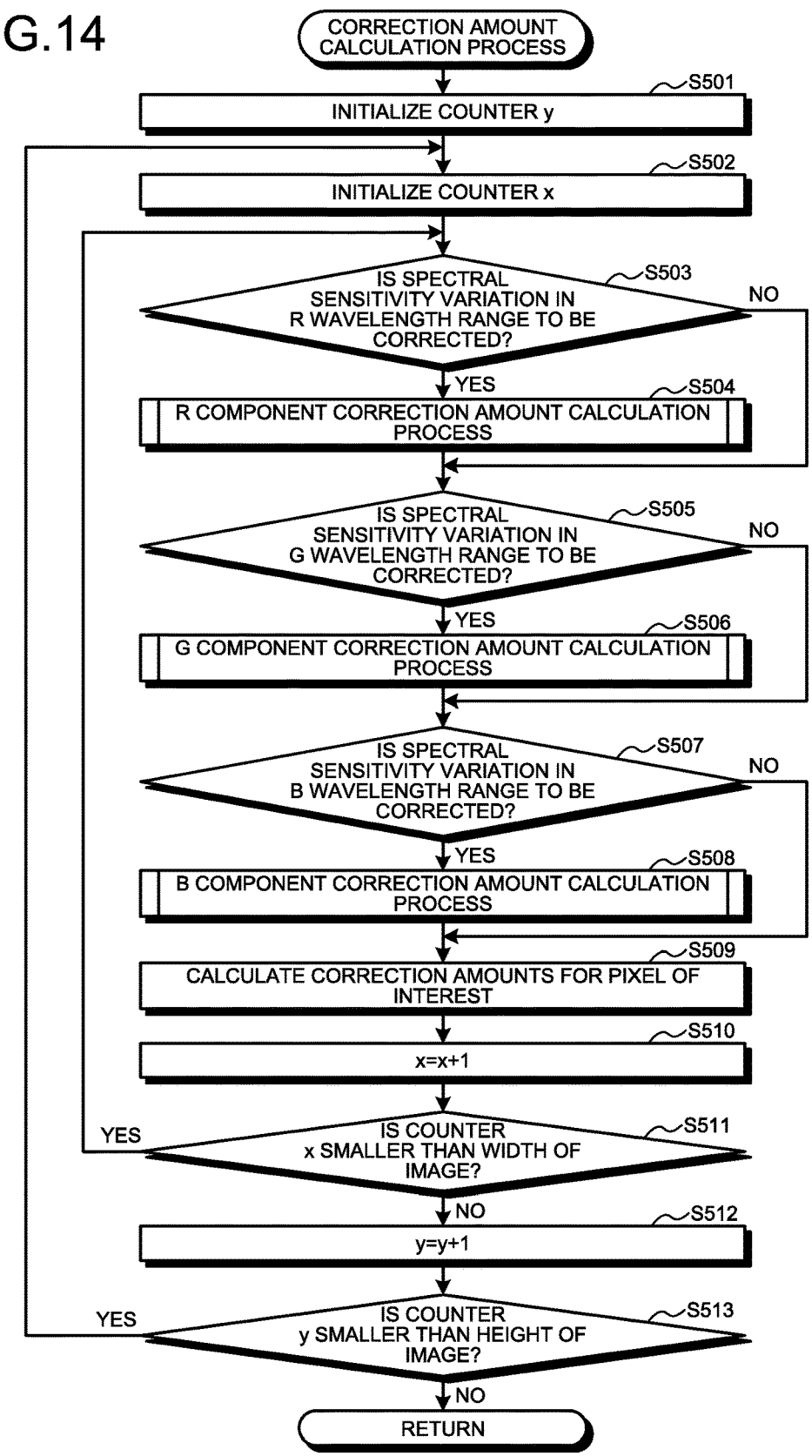
FIG. 14 is a flowchart illustrating an outline of a correction amount calculation process in FIG. 13.

Next, details of the correction amount calculation process described in step S401 of FIG. 13 will be described. FIG. 14 is a flowchart illustrating an outline of the correction amount calculation process.

As illustrated in FIG. 14, the correction amount calculating unit 404 first initializes a counter y indicating a position of a pixel in a height direction (vertical direction) of an image corresponding to the image data stored in the second buffer 402b of the second recording unit 402 (counter y=0) (step S501), and initializes a counter x indicating a position of a pixel in a width direction (lateral direction) of the image corresponding to the image data (counter x=0) (step S502).

Subsequently, if the spectral sensitivity variation in the R wavelength range of a pixel of interest at coordinate (x, y) in the image data is to be corrected (step S503: Yes), the correction amount calculating unit 404 proceeds to step S504, which will be described later. In contrast, if the spectral sensitivity in the R wavelength range of the pixel of interest at coordinate (x, y) is not to be corrected (step S503: No), the correction amount calculating unit 404 proceeds to step S505, which will be described later.

In step S504, the correction amount calculating unit 404 performs an R component correction amount calculation process of calculating a correction amount for an R component. An R component refers to a pixel value in the R wavelength range.

Figure 15:
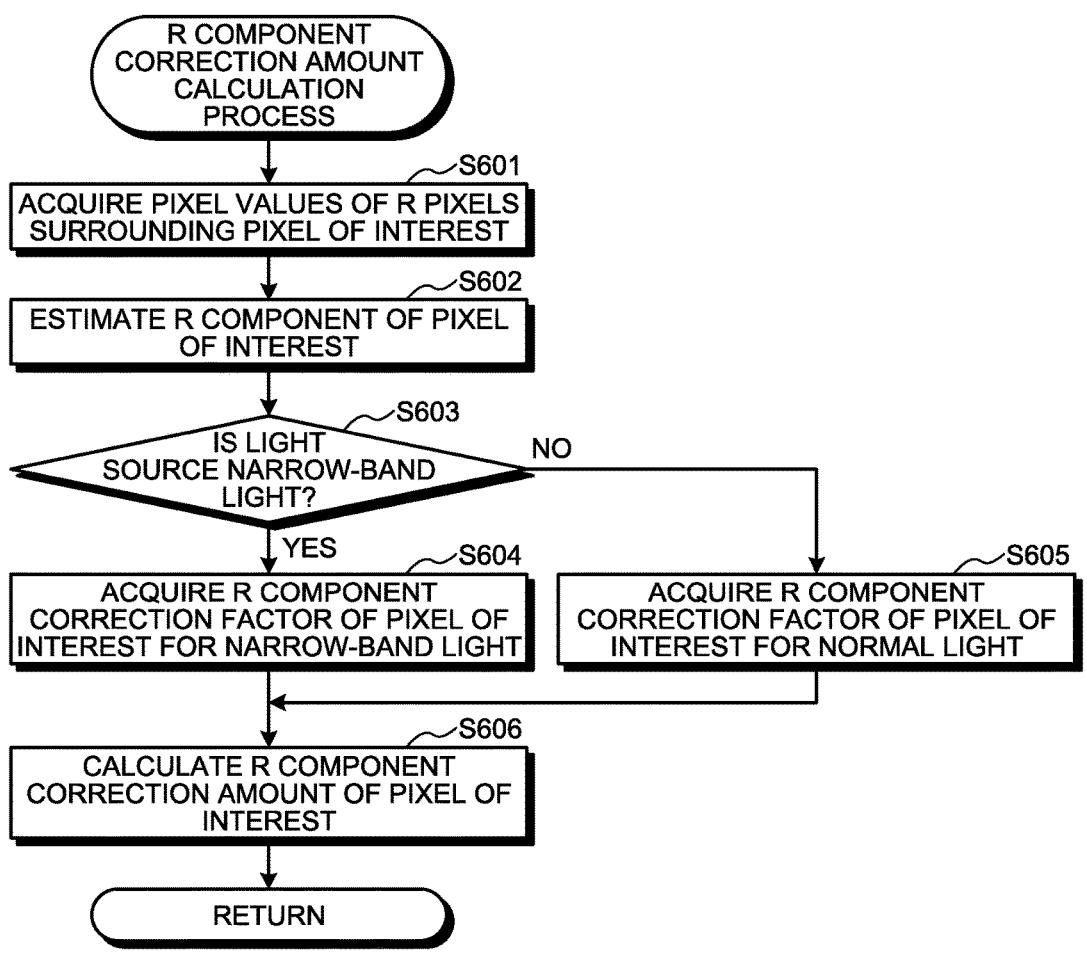
FIG. 15 is a flowchart illustrating an outline of an R component correction amount calculation process in FIG. 14.

FIG. 15 is a flowchart illustrating an outline of the R component correction amount calculation process in step S504. As illustrated in FIG. 15, the correction amount calculating unit 404 acquires pixel values of R pixels surrounding the pixel of interest at coordinate (x, y) from the second buffer 402b (step S601).

Figure 16A:
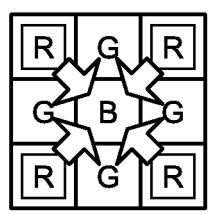
FIG. 16A is a diagram schematically explaining an interpolation method for estimating an R component when a pixel of interest is a B pixel.
Figure 16B:
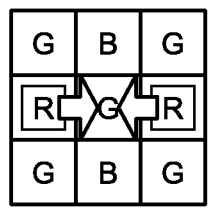
FIG. 16B is a diagram schematically explaining an interpolation method for estimating an R component when a pixel of interest is a G pixel.
Figure 16C:
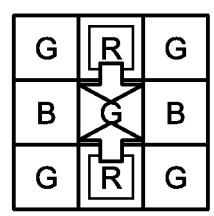
FIG. 16C is a diagram schematically explaining an interpolation method for estimating an R component when a pixel of interest is a G pixel.
Figure 16D:
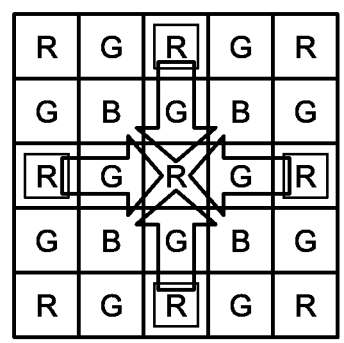
FIG. 16D is a diagram schematically explaining an interpolation method for estimating an R component when a pixel of interest is an R pixel.

Subsequently, the correction amount calculating unit 404 estimates the pixel value of the R component of the pixel of interest at coordinate (x, y) by interpolation using the pixel values of the neighboring R pixels acquired in step S601 (step S602). For example, as illustrated in FIGS. 16A to 16D, the interpolation method performed by the correction amount calculating unit 404 estimates the pixel value of the R component of the pixel of interest at coordinate (x, y) by obtaining an average value of the pixel values of the R pixels around the pixel of interest depending on the color of the filter on the pixel of interest at coordinate (x, y). Specifically, as illustrated in FIG. 16A, in a case of a B pixel where the color of the filter on the pixel of interest at coordinate (x, y) is blue, the correction amount calculating unit 404 estimates an average value of the pixel values of R pixels adjacent in four diagonal directions (see FIG. 16A) as the pixel value of the R component of the pixel of interest at coordinate (x, y), and in a case of a G pixel where the color of the filter on the pixel of interest at coordinate (x, y) is green, the correction amount calculating unit 404 estimates an average value of the pixel values of adjacent R pixels (see FIGS. 16B and 16C) as the pixel value of the R component of the pixel of interest at coordinate (x, y). Furthermore, in a case of an R pixel where the color of the filter on the pixel of interest is red, the correction amount calculating unit 404 estimates an average value of four R pixel values at two-pixel distance in the horizontal and vertical directions (see FIG. 16D) as an average pixel value of the R component of the pixel of interest at coordinate (x, y). In a case where the pixel of interest is an R pixel, the correction amount calculating unit 404 may calculate an average value of pixel values including that of the pixel of interest as an average pixel value of the R component. Alternatively, an edge direction or the like may be detected, and a weighted average value may be calculated in such a manner that a larger weight is placed on pixel values in the edge direction.

Thereafter, if narrow-band light was emitted to the object for capturing the image (step S603: Yes), the correction amount calculating unit 404 proceeds to step S604, which will be described later. In contrast, if narrow-band light was not emitted to the object for capturing the image (step S603: No), the correction amount calculating unit 404 proceeds to step S605, which will be described later. The determination on the light source may be performed by selecting from a menu, for example, or may be made by the correction amount calculating unit 404 based on color distribution of the image corresponding to the image data. Alternatively, the correction amount calculating unit 404 may directly acquire information on an external light source. Still alternatively, in a case of combined light where normal light and narrow-band light are combined (for example, in a case of light from an LED lamp and normal light), the correction amount calculating unit 404 may preferentially select the narrow-band light within a range where light emitted by the LED lamp reaches while selecting normal light outside of the range. In this process, the correction amount calculating unit 404 may detect whether or not a plurality of light sources are reflected in each of a plurality of pixels constituting the image corresponding to the image data, determine whether or not combined light is used based on the detection result, and then select a correction factor for narrow-band light or a correction factor for normal light for each pixel, or combine a correction factor for narrow-band light and a correction factor for normal light for each pixel depending on the combination ratio of the combined light.

In step S604, the correction amount calculating unit 404 acquires a correction factor of the R component of the pixel of interest at coordinate (x, y) for the light source of narrow-band light from the second buffer 402b. After step S604, the correction amount calculating unit 404 proceeds to step S606, which will be described later.

In step S605, the correction amount calculating unit 404 acquires a correction factor of the R component of the pixel of interest at coordinate (x, y) for the normal light from the second buffer 402b. After step S605, the correction amount calculating unit 404 proceeds to step S606, which will be described later.

Subsequently, the correction amount calculating unit 404 calculates the correction amount of the R component for the pixel value of the pixel of interest at coordinate (x, y) by multiplying the pixel value of the R component of the pixel of interest at coordinate (x, y) (which is the average pixel value of the R component when the pixel of interest is an R pixel) estimated in step S602 described above by the correction factor for the R component of the pixel of interest at coordinate (x, y) (step S606). After step S606, the correction amount calculating unit 404 returns to the correction amount calculation process in FIG. 14.

Referring back to FIG. 14, the explanation of step S505 and subsequent steps will be provided.

In step S505, if the spectral sensitivity variation in the G wavelength range of the pixel of interest at coordinate (x, y) is to be corrected (step S505: Yes), the correction amount calculating unit 404 proceeds to step S506, which will be described later. In contrast, if the spectral sensitivity in the G wavelength range of the pixel of interest at coordinate (x, y) is not to be corrected (step S505: No), the correction amount calculating unit 404 proceeds to step S507, which will be described later.

In step S506, the correction amount calculating unit 404 performs a G component correction amount calculation process of calculating a correction amount for a G component. G component refers to a pixel value in the G wavelength range.

Figure 17:
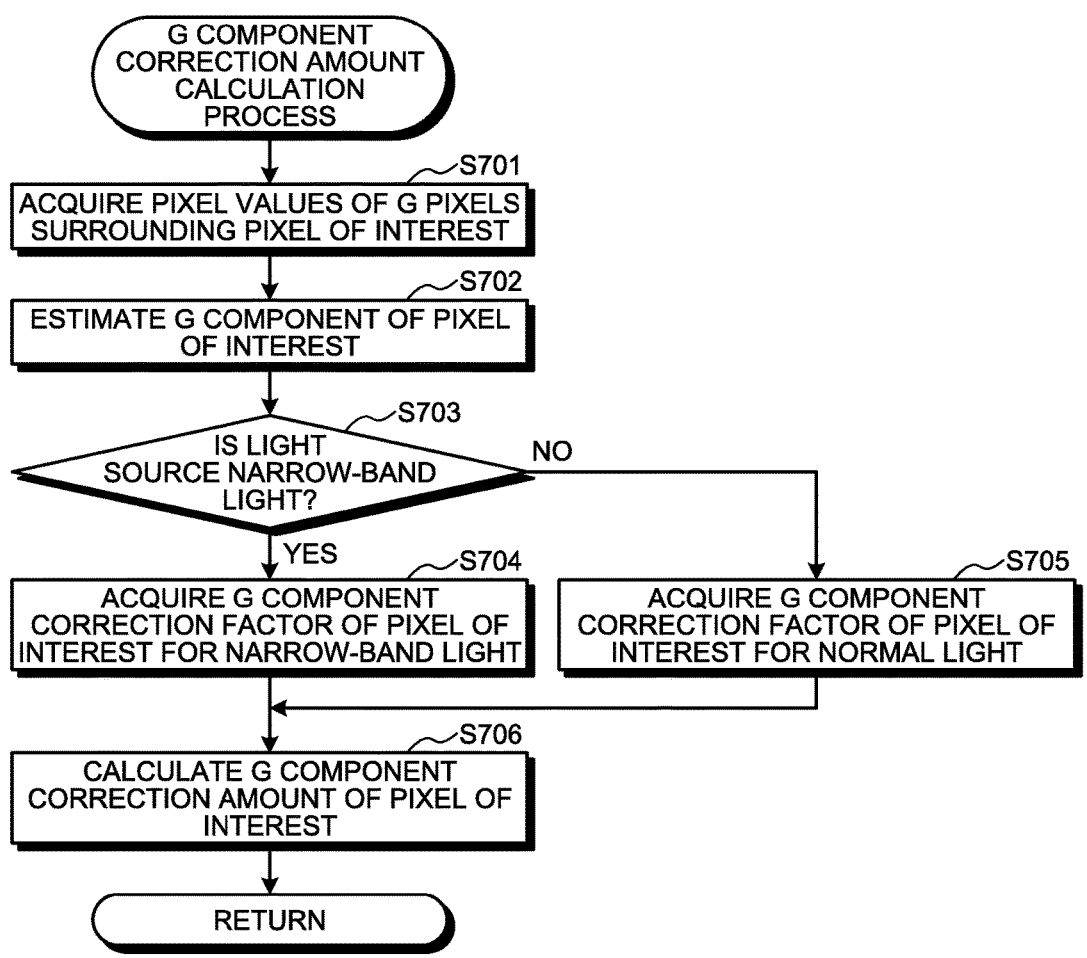
FIG. 17 is a flowchart illustrating an outline of a G component correction amount calculation process in FIG. 14.
Figure 18A:
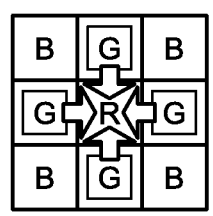
FIG. 18A is a diagram schematically explaining an interpolation method for estimating a G component when a pixel of interest is an R pixel.
Figure 18B:
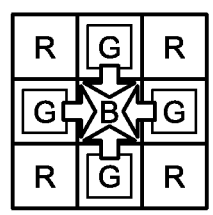
FIG. 18B is a diagram schematically explaining an interpolation method for estimating a G component when a pixel of interest is a B pixel.
Figure 18C:
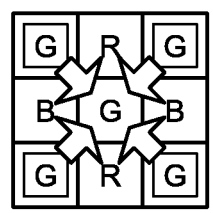
FIG. 18C is a diagram schematically explaining an interpolation method for estimating a G component when a pixel of interest is a G pixel.
Figure 18D:
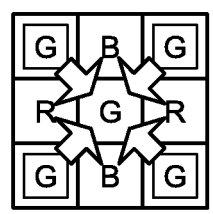
FIG. 18D is a diagram schematically explaining an interpolation method for estimating a G component when a pixel of interest is a G pixel.

FIG. 17 is a flowchart illustrating an outline of the G component correction amount calculation process in step S506. As illustrated in FIG. 17, the correction amount calculating unit 404 acquires pixel values of G pixels surrounding the pixel of interest at coordinate (x, y) from the second buffer 402b (step S701).

Subsequently, the correction amount calculating unit 404 estimates the pixel value of the G component of the pixel of interest at coordinate (x, y) by interpolation using the pixel values of the neighboring G pixels acquired in step S701 (step S702). For example, as illustrated in FIG. 18A to 18D, in a case of an R pixel where the color of the filter on the pixel of interest at coordinate (x, y) is red, the correction amount calculating unit 404 estimates an average value of the pixel values of G pixels adjacent in the horizontal and vertical directions (see FIG. 18A) as the pixel value of the G component of the pixel of interest at coordinate (x, y), and in a case of a B pixel where the color of the filter on the pixel of interest at coordinate (x, y) is blue, the correction amount calculating unit 404 estimates an average value of the pixel values of G pixels adjacent in the horizontal and vertical directions (see FIG. 18B) as the pixel value of the G component of the pixel of interest at coordinate (x, y). Furthermore, in a case of a G pixel where the color of the filter on the pixel of interest is green, the correction amount calculating unit 404 estimates an average value of G pixel values adjacent in four diagonal directions (see FIGS. 18C and 18D) as an average pixel value of the G component of the pixel of interest at coordinate (x, y). In a case where the pixel of interest is a G pixel, the correction amount calculating unit 404 may calculate an average value of pixel values including that of the pixel of interest as an average pixel value of the G component. Alternatively, the correction amount calculating unit 404 may detect an edge direction or the like, and calculate a weighted average value in such a manner that a larger weight is placed on pixel values in the edge direction.

Thereafter, if narrow-band light was emitted to the object for capturing the image (step S703: Yes), the correction amount calculating unit 404 proceeds to step S704, which will be described later. In contrast, if narrow-band light was not emitted to the object for capturing the image (step S703: No), the correction amount calculating unit 404 proceeds to step S705, which will be described later.

In step S704, the correction amount calculating unit 404 acquires a correction factor of the G component (the pixel value in the G wavelength range) of the pixel of interest at coordinate (x, y) for the light source of narrow-band light from the second buffer 402b. After step S704, the correction amount calculating unit 404 proceeds to step S706, which will be described later.

In step S705, the correction amount calculating unit 404 acquires a correction factor of the G component of the pixel of interest at coordinate (x, y) for the normal light from the second buffer 402b. After step S705, the correction amount calculating unit 404 proceeds to step S706, which will be described later.

Subsequently, the correction amount calculating unit 404 calculates the correction amount of the G component for the pixel value of the pixel of interest at coordinate (x, y) by multiplying the pixel value of the G component of the pixel of interest at coordinate (x, y) (the average pixel value of the G component when the pixel of interest is a G pixel) estimated in step S702 described above by the correction factor for the G component of the pixel of interest at coordinate (x, y) (step S706). After step S706, the correction amount calculating unit 404 returns to the correction amount calculation process in FIG. 14.

Referring back to FIG. 14, the description of step S507 and subsequent steps will be provided.

In step S507, if the spectral sensitivity variation in the B wavelength range of the pixel of interest at coordinate (x, y) is to be corrected (step S507: Yes), the correction amount calculating unit 404 proceeds to step S508, which will be described later. In contrast, if the spectral sensitivity in the B wavelength range of the pixel of interest at coordinate (x, y) is not to be corrected (step S507: No), the correction amount calculating unit 404 proceeds to step S509, which will be described later.

In step S508, the correction amount calculating unit 404 performs a B component correction amount calculation process of calculating a correction amount for a B component. B component refers to a pixel value in the B wavelength range.

Figure 19:
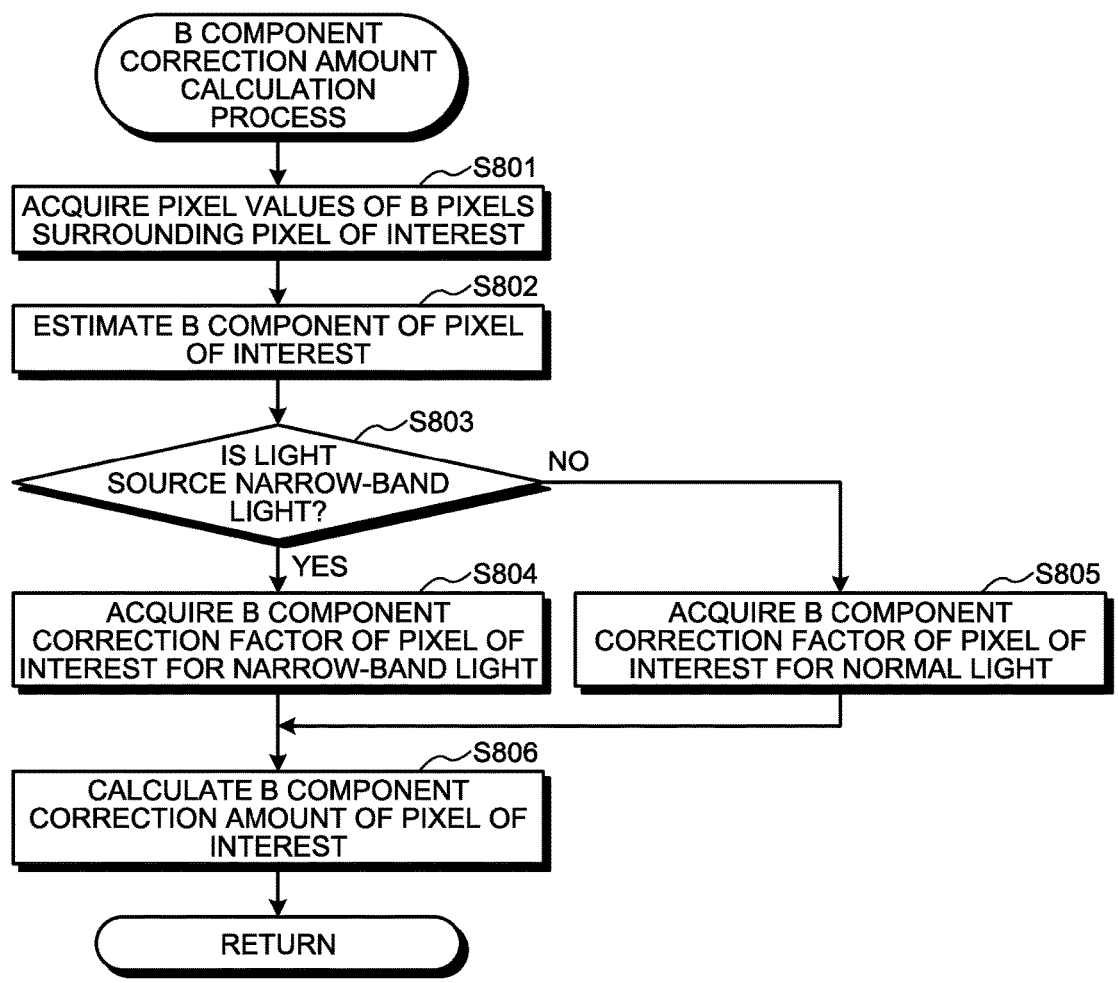
FIG. 19 is a flowchart illustrating an outline of a B component correction amount calculation process in FIG. 14.
Figure 20A:
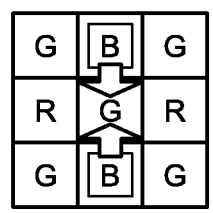
FIG. 20A is a diagram schematically explaining an interpolation method for estimating a B component when a pixel of interest is a G pixel.
Figure 20B:
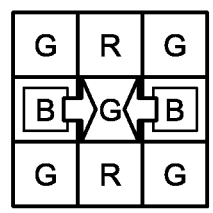
FIG. 20B is a diagram schematically explaining an interpolation method for estimating a B component when a pixel of interest is a G pixel.
Figure 20C:
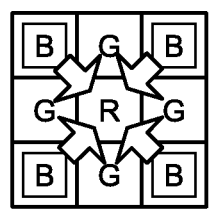
FIG. 20C is a diagram schematically explaining an interpolation method for estimating a B component when a pixel of interest is an R pixel.
Figure 20D:
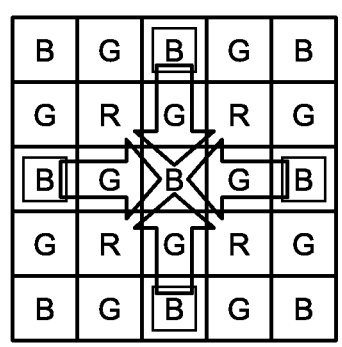
FIG. 20D is a diagram schematically explaining an interpolation method for estimating a B component when a pixel of interest is a B pixel.

FIG. 19 is a flowchart illustrating an outline of the B component correction amount calculation process in step S508. As illustrated in FIG. 19, the correction amount calculating unit 404 acquires pixel values of B pixels surrounding the pixel of interest at coordinate (x, y) from the second buffer 402b (step S801).

Subsequently, the correction amount calculating unit 404 estimates the pixel value of the B component of the pixel of interest at coordinate (x, y) by interpolation using the pixel values of the neighboring B pixels acquired in step S801 (step S802). For example, as illustrated in FIG. 20A to 20D, in a case of a G pixel where the color of the filter on the pixel of interest at coordinate (x, y) is green, the correction amount calculating unit 404 estimates an average value of the pixel values of B pixels adjacent in the vertical direction or the left-right horizontal direction (see FIGS. 20A and 20B) as the pixel value of the B component of the pixel of interest at coordinate (x, y), and in a case of an R pixel where the color of the filter on the pixel of interest at coordinate (x, y) is red, the correction amount calculating unit 404 estimates an average value of the pixel values of B pixels adjacent in the diagonal directions (see FIG. 20C) as the pixel value of the B component of the pixel of interest at coordinate (x, y). Furthermore, in a case of a B pixel where the color of the filter on the pixel of interest is blue, the correction amount calculating unit 404 estimates an average value of four B pixel values at two-pixel distance in the horizontal and vertical directions (see FIG. 20D) as an average pixel value of the B component of the pixel of interest at coordinate (x, y). In a case where the pixel of interest is a B pixel, the correction amount calculating unit 404 may calculate an average value of pixel values including that of the pixel of interest as an average pixel value of the B component. Alternatively, the correction amount calculating unit 404 may detect an edge direction or the like, and calculate a weighted average value in such a manner that a larger weight is placed on pixel values in the edge direction.

Thereafter, if narrow-band light was emitted to the object for capturing the image (step S803: Yes), the correction amount calculating unit 404 proceeds to step S804, which will be described later. In contrast, if narrow-band light was not emitted to the object for capturing the image (step S803: No), the correction amount calculating unit 404 proceeds to step S805, which will be described later.

In step S804, the correction amount calculating unit 404 acquires a correction factor of the B component at coordinates (x, y) for the light source of narrow-band light from the second buffer 402b. After step S804, the correction amount calculating unit 404 proceeds to step S806, which will be described later.

In step S805, the correction amount calculating unit 404 acquires a correction factor of the B component at coordinates (x, y) for the normal light from the second buffer 402b. After step S805, the correction amount calculating unit 404 proceeds to step S806, which will be described later.

Subsequently, the correction amount calculating unit 404 calculates the correction amount of the B component for the pixel value of the pixel of interest at coordinate (x, y) by multiplying the pixel value of the B component of the pixel of interest at coordinate (x, y) (the average pixel value of the B component when the pixel of interest is a B pixel) estimated in step S802 described above by the correction factor for the B component of the pixel of interest at coordinate (x, y) (step S806). After step S806, the correction amount calculating unit 404 returns to the correction amount calculation process in FIG. 14.

Referring back to FIG. 14, the description of step S509 and subsequent steps will be provided.

In step S509, the correction amount calculating unit 404 calculates a sum of the correction amounts of the pixel of interest at coordinate (x, y) calculated in steps S503 to S508 described above (the correction amount for a component that is not calculated is assumed to be 0) as a correction amount for the pixel of interest at coordinate (x, y).

Subsequently, the correction amount calculating unit 404 increments the counter x (x=x+1) (step S510).

Thereafter, if the counter x is smaller than the width of the image corresponding to the image data (step S511: Yes), the correction amount calculating unit 404 returns to step S503. In contrast, if the counter x is not smaller than the width of the image corresponding to the image data (step S511: No), the correction amount calculating unit 404 proceeds to step S512.

Subsequently, the correction amount calculating unit 404 increments the counter y (y=y+1) (step S512).

Thereafter, if the counter y is smaller than the height of the image corresponding to the image data (step S513: Yes), the correction amount calculating unit 404 returns to step S502. In contrast, if the counter y is not smaller than the height of the image corresponding to the image data (step S513: No), the correction amount calculating unit 404 returns to the main routine in FIG. 13.

As described above, in the second image processing apparatus 40, the correction amount calculating unit 404 acquires the correction factors recorded by the correction factor recording unit 113b of the imaging device 10, and calculates the correction amount for correcting the pixel value of the pixel of interest based on the acquired correction factors and the pixel values of surrounding pixels of the pixel of interest, and the pixel value correcting unit 405 corrects the pixel value of the pixel of interest by using the correction amount calculated by the correction amount calculating unit 404. This allows correction of variation in spectral sensitivity of each of the pixels of the image sensor 105. While the second image processing apparatus 40 corrects the respective pixel values of R pixels, G pixels, and B pixels, the second image processing apparatus 40 may correct only the pixel values of the R components of G pixels, for example.

In addition, since a wavelength range of relatively low spectral sensitivity is more affected by variation in spectral sensitivity than a wavelength range of relatively high spectral sensitivity as described above, the second image processing apparatus 40 may correct only the wavelength ranges of colors different from the of the filter on the pixel of interest. In this case, it may be determined to be Yes in step S503 if the pixel of interest is not an R pixel, it may be determined to be Yes in step S505 if the pixel of interest is not a G pixel, and it may be determined to be Yes in step S507 if the pixel of interest is not a B pixel. In this manner, the amount of computation is reduced as compared to the above.

According to the first embodiment of the present invention described above, since the correction factor calculating unit 307 calculates, for pixels, correction factors for correcting differences in pixel values due to differences in the spectral sensitivity and the preset reference spectral sensitivity at a pixel of interest in image data generated by the image sensor 105 provided with one of color filters 106 of a plurality of colors having different spectral transmittances from one another on the light receiving surface of each of a plurality of pixels, it is possible to efficiently calculate correction factors for correcting variation in spectral sensitivity for each of the plurality of pixels of the image sensor 105.

In addition, according to the first embodiment of the present invention, the correction factor calculating unit 307 changes the detection method depending on the light source used in capturing an image, which allows calculation of correction factors for correcting variation in spectral sensitivity appropriate for each of the pixels depending on the light source.

In addition, according to the first embodiment of the present invention, since the correction amount calculating unit 404 calculates the correction amount for correcting the pixel value of the pixel of interest based on the correction factors for the pixel of interest recorded by the correction factor recording unit 113b and the pixel values of surrounding pixels of the pixel of interest, and since the pixel value correcting unit 405 corrects the pixel value of the pixel of interest based on the correction amount calculated by the correction amount calculating unit 404, differences in pixel values caused by variation in spectral sensitivity are corrected for each pixel.

In addition, according to the first embodiment of the present invention, since the correction amount calculating unit 404 acquires correction factors depending on the light source used in capturing an image from the correction factor recording unit 113b, an appropriate correction amount of a pixel value of a pixel of interest depending on the light source is calculated.

While the imaging device 10 and the first image processing apparatus 30 are provided separately in the first embodiment of the present invention, the first image processing apparatus 30 may be provided in the imaging device 10.

In addition, while the imaging device 10 and the second image processing apparatus 40 are provided separately in the first embodiment of the present invention, the second image processing apparatus 40 may be provided in the imaging device 10.

Second Embodiment

Next, a second embodiment of the present invention will be described. An imaging system according to the second embodiment has the same configuration as that of the imaging system 1 according to the first embodiment described above, but differs therefrom in processing performed by the first image processing apparatus. Specifically, while the light source device 20 that is an object emits normal light or light having specific wavelengths in the first embodiment described above, the light source device 20 is made to emit light of the respective wavelength ranges of red, green, and blue in the second embodiment. Thus, the processing performed by the second image processing apparatus according to the second embodiment will be described. The same elements as those in the imaging system 1 according to the first embodiment will be denoted by the same reference signs, and the explanation thereof will not be repeated.

Processing of Second Image Processing Apparatus

Figure 21:
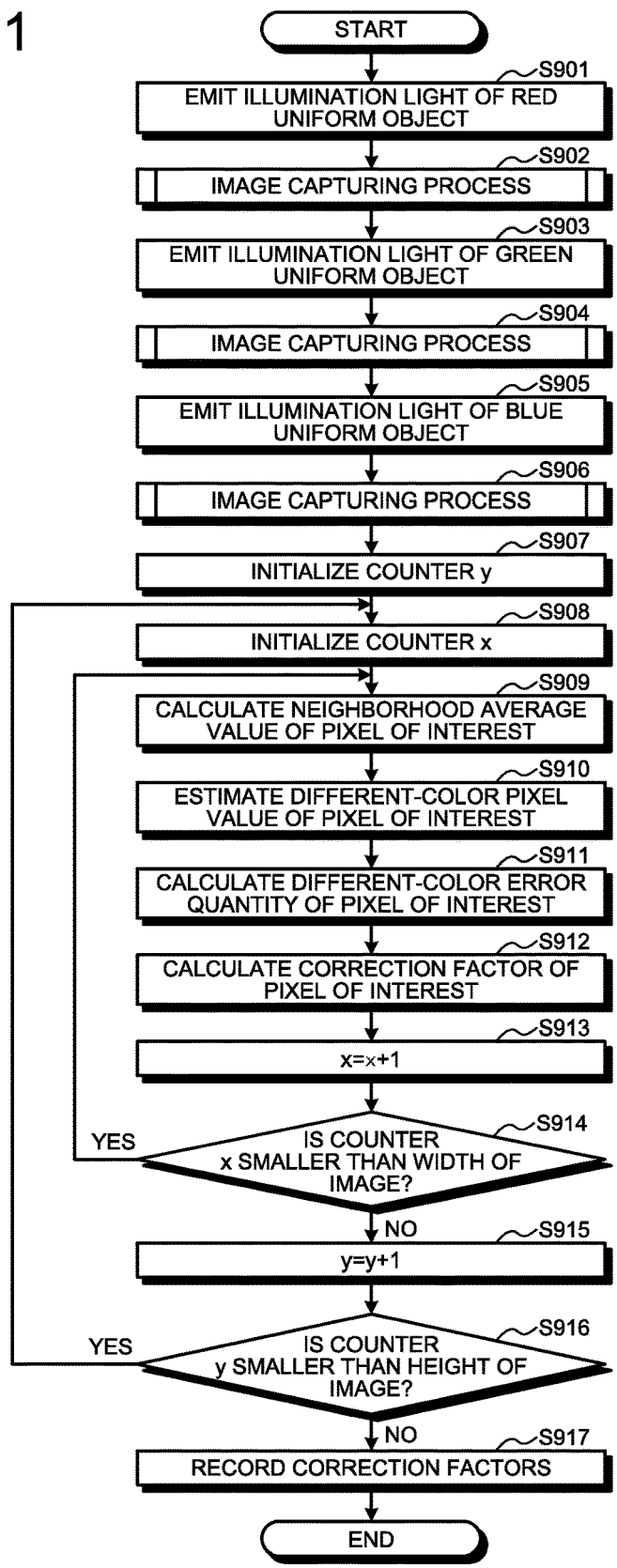
FIG. 21 is a flowchart illustrating an outline of processing performed by a first image processing apparatus according to a second embodiment of the present invention.

FIG. 21 is a flowchart illustrating an outline of the processing performed by the first image processing apparatus 30, and illustrates a main routine. In FIG. 21, processing for calculating correction factors for correcting the spectral sensitivities of pixels performed by the first image processing apparatus 30 will be described.

Figure 22:
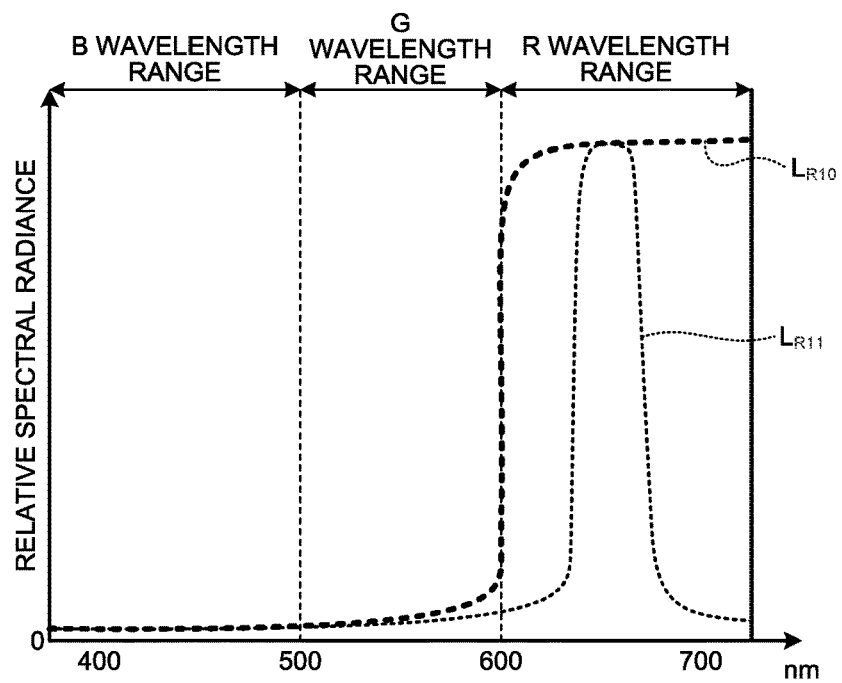
FIG. 22 is a graph schematically illustrating spectral characteristics of a red object in calculation of correction factors performed by the first image processing apparatus according to the second embodiment of the present invention.

As illustrated in FIG. 21, the light source control unit 302 sets the wavelength range of light (object) to be emitted by the light source device 20 to a red wavelength range, and causes illumination light to be emitted as a red uniform object (step S901). Specifically, as illustrated by a curve $L_{R10}$ in FIG. 22, the light source control unit 302 sets the wavelength range of light to be emitted by the light source device 20 to from 600 to 780 nm, and causes uniform red light, which has a spectral radiance higher than the other wavelength ranges, to be emitted as an object toward the imaging device 10. Alternatively, as illustrated by a curve $L_{R11}$ in FIG. 22, the light source control unit 302 may cause narrow-band light, which has a wavelength range narrower than the wavelength range of 600 to 780 nm, to be emitted to the light source device 20.

Subsequently, the first image processing apparatus 30 causes the imaging device 10 to perform an image capturing process of capturing the red illumination light emitted by the light source device 20 a plurality of times and calculating average values of pixel values of pixels of the image sensor 105 (step S902). Since the image capturing process is similar to the image capturing process in FIG. 9 described above, the description thereof will not be repeated.

Figure 23:
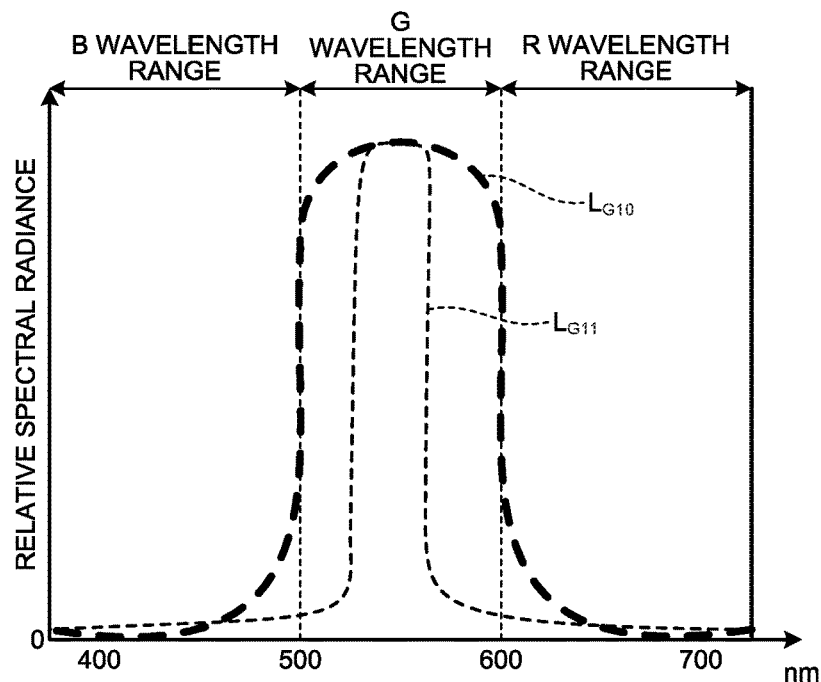
FIG. 23 is a graph schematically illustrating spectral characteristics of a green object in calculation of correction factors performed by the first image processing apparatus according to the second embodiment of the present invention.

Thereafter, the light source control unit 302 sets the wavelength range of light to be emitted by the light source device 20 to a green wavelength range, and causes the light to be emitted (step S903). Specifically, as illustrated by a curve $L_{G10}$ in FIG. 23, the light source control unit 302 sets the wavelength range of light to be emitted by the light source device 20 to from 500 to 600 nm, and causes uniform green light, which has a spectral radiance higher than the other wavelength ranges, to be emitted as an object toward the imaging device 10. Alternatively, as illustrated by a curve $L_{G11}$ in FIG. 23, the light source control unit 302 may cause narrow-band light, which has a wavelength range narrower than the wavelength range of 500 to 600 nm, to be emitted to the light source device 20.

Subsequently, the first image processing apparatus 30 causes the imaging device 10 to perform an image capturing process of capturing the green illumination light emitted by the light source device 20 a plurality of times and calculating average values of pixel values of the pixels of the image sensor 105 (step S904). Since the image capturing process is similar to the image capturing process in FIG. 9 described above, the description thereof will not be repeated.

Figure 24:
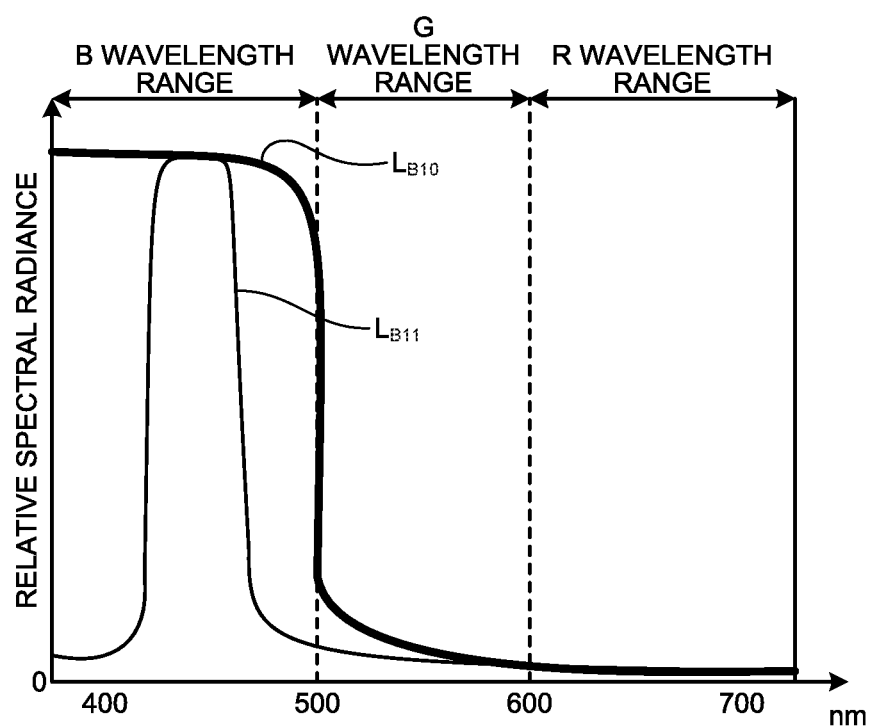
FIG. 24 is a graph schematically illustrating spectral characteristics of a blue object in calculation of correction factors performed by the first image processing apparatus according to the second embodiment of the present invention.

Thereafter, the light source control unit 302 sets the wavelength range of light to be emitted by the light source device 20 to a blue wavelength range, and causes the light to be emitted (step S905). Specifically, as illustrated by a curve $L_{B10}$ in FIG. 24, the light source control unit 302 sets the wavelength range of light to be emitted by the light source device 20 to from 380 to 500 nm, and causes uniform blue light, which has a spectral radiance higher than the other wavelength ranges, to be emitted as an object toward the imaging device 10. Alternatively, as illustrated by a curve $L_{B11}$ in FIG. 24, the light source control unit 302 may cause narrow-band light, which has a wavelength range narrower than the wavelength range of 380 to 500 nm, to be emitted to the light source device 20.

Subsequently, the first image processing apparatus 30 causes the imaging device 10 to perform an image capturing process of capturing the blue illumination light emitted by the light source device 20 a plurality of times and calculating average values of pixel values of pixels of the image sensor 105 (step S906). Since the image capturing process is similar to the image capturing process in FIG. 9 described above, the description thereof will not be repeated.

Thereafter, the correction factor calculating unit 307 initializes a counter y indicating a position of a pixel in a height direction (vertical direction) of an image corresponding to the image data recorded in the first buffer 304b (counter y=0) (step S907), and initializes a counter x indicating a position of a pixel in a width direction (lateral direction) of the image corresponding to the image data (counter x=0) (step S908).

Figure 25A:
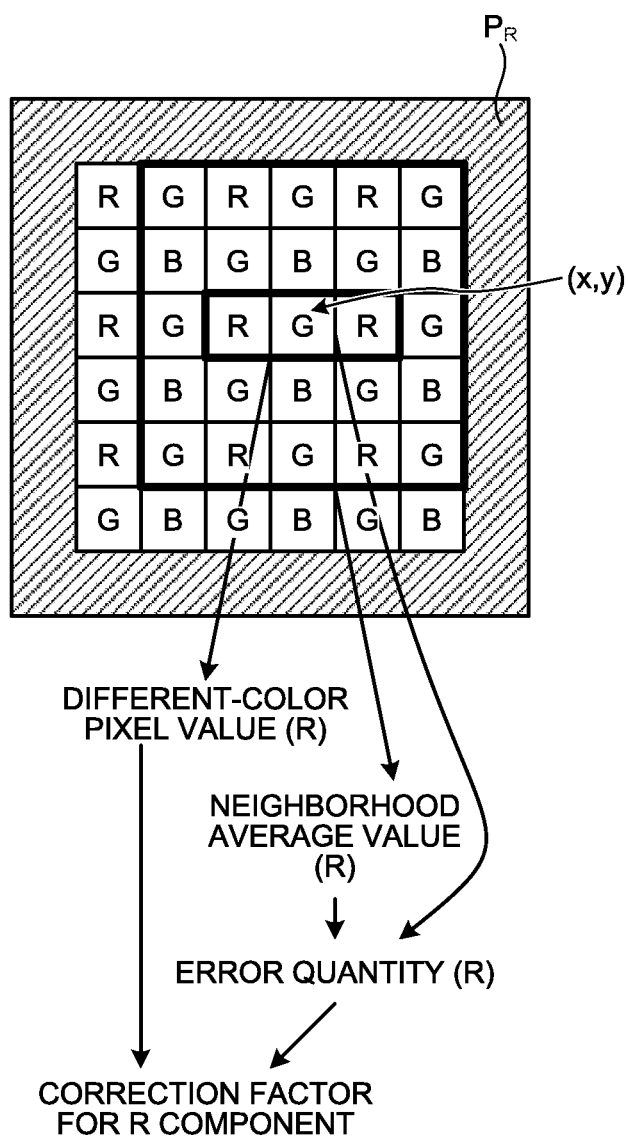
FIG. 25A is a diagram schematically explaining calculation of a correction factor of an R component when a pixel of interest is a G pixel.
Figure 25B:
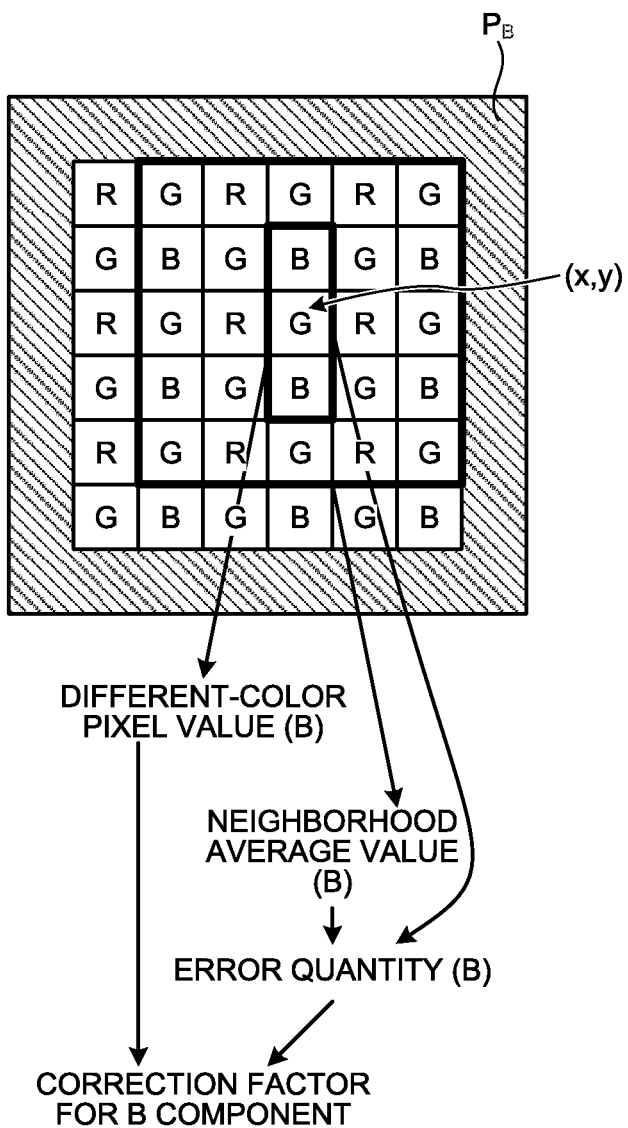
FIG. 25B is a diagram schematically explaining calculation of a correction factor of a B component when a pixel of interest is a G pixel.

Subsequently, the correction factor calculating unit 307 calculates a neighborhood average value of a pixel of interest at coordinate (x, y) by using surrounding pixels of the same color of the color filter as that of the pixel of interest at coordinate (x, y) (step S909). Specifically, the correction factor calculating unit 307 calculates the neighborhood average value of the pixel of interest at coordinate (x, y) by using the surrounding pixels of pixels capturing illumination light having a color different from the color of the pixel of interest. For example, as illustrated in FIGS. 25A and 25B, when the pixel of interest is a G pixel, the correction factor calculating unit 307 calculates a neighborhood average value R and a neighborhood average value B of the pixel of interest at coordinate (x, y) by using surrounding pixels in an image $P_R$ obtained by capturing red illumination light and an image $P_B$ obtained by capturing blue illumination light. Surrounding pixels refer to pixels included in a range of 5×5 pixels with the pixel of interest at the center, and having the same color as the pixel of interest but except the pixel of interest. Alternatively, the correction factor calculating unit 307 may calculate the neighborhood average value R and the neighborhood average value B by using surrounding pixels, which are pixels included in a range of another size such as 3×3 or 7×7 with the pixel of interest at the center but except the pixel of interest. Alternatively, the correction factor calculating unit 307 may calculate the neighborhood average value R and the neighborhood average value B by using surrounding pixels, which are pixels included in a range of a size such as 3×3, 5×5 or 7×7 with the pixel of interest at the center and including the pixel of interest.

Thereafter, the correction factor calculating unit 307 estimates different-color pixel values of the pixel of interest at coordinate (x, y) by interpolation using pixel values of pixels, which are surrounding pixels of the pixel of interest at coordinate (x, y) in an image obtained by capturing illumination light of a color different from that of the pixel of interest at coordinate (x, y) and which are of the same color as the object (step S910). The surrounding pixels refer to pixels located adjacent to the pixel of interest and pixels located near the pixel of interest. Specifically, as illustrated in FIGS. 25A and 25B, when the pixel of interest at coordinate (x, y) is a G pixel, the correction factor calculating unit 307 estimates a different-color pixel value (R) of an R pixel at the pixel of interest at coordinate (x, y) by using neighboring R pixels of the pixel of interest at coordinate (x, y) in an image $P_R$ obtained by capturing red illumination light, and estimates a different-color pixel value (B) of a B pixel at the pixel of interest at coordinate (x, y) by using neighboring B pixels of the pixel of interest at coordinate (x, y) in an image $P_B$ obtained by capturing blue illumination light.

Subsequently, the correction factor calculating unit 307 calculates a difference between the neighborhood average value of the pixel of interest at coordinate (x, y) calculated in step S909 and the pixel value of the pixel of interest at coordinate (x, y) in the image from which the neighborhood average value is calculated as an error quantity (step S911). The error quantity has a positive value if the pixel value of the pixel of interest at coordinate (x, y) is larger than the neighborhood average value, and has a negative value if the pixel value of the pixel of interest is smaller than the neighborhood average value.

Thereafter, the correction factor calculating unit 307 calculates a correction factor by dividing the error quantity at the pixel of interest at coordinate (x, y) calculated in step S911 described above by the different-color pixel value estimated in step S910 (step S912). Specifically, when the pixel of interest is a G pixel, the correction factor calculating unit 307 calculates a correction factor of an R component and a correction factor of a B component, respectively, by dividing the error quantity calculated from the image obtained by capturing red illumination light by the different-color pixel value (R) estimated by using the pixel values of neighboring R pixels of the pixel of interest from the same image and by dividing the error quantity calculated from the image obtained by capturing blue illumination light by the different-color pixel value (B) estimated by using the pixel values of neighboring B pixels of the pixel of interest from the same image.

Subsequently, the correction factor calculating unit 307 increments the counter x (x=x+1) (step S913).

Thereafter, if the counter x is smaller than the width of the image corresponding to the image data (step S914: Yes), the correction factor calculating unit 307 returns to step S909. In contrast, if the counter x is not smaller than the width of the image corresponding to the image data (step S914: No), the correction factor calculating unit 307 proceeds to step S915.

Subsequently, the correction factor calculating unit 307 increments the counter y (y=y+1) (step S915).

Thereafter, if the counter y is smaller than the height of the image corresponding to the image data (step S916: Yes), the correction factor calculating unit 307 returns to step S908. In contrast, if the counter y is not smaller than the height of the image corresponding to the image data (step S916: No), the correction factor calculating unit 307 proceeds to step S917.

Subsequently, the correction factor calculating unit 307 records, for each of the pixels of the image sensor 105, correction factors calculated for wavelength ranges other than the same wavelength range as that of the color filter 106, in the first recording unit 304 (step S917). For example, if the color filter 106 has a Bayer array of RGB, the correction factor calculating unit 307 records, in the correction factor recording unit 113b of the imaging device 10, the correction factors calculated for the B and G wavelength ranges in the case of an R pixel, the correction factors calculated for the R and B wavelength ranges in the case of a G pixel, and the correction factors calculated for the R and G wavelength ranges in the case of a B pixel. After step S917, the second image processing apparatus 40 terminates the processing.

According to the second embodiment of the present invention described above, light in each of the wavelength ranges of red, green, and blue is emitted as an object, which allows the correction factor calculating unit 307 to simply calculate correction factors for correcting variation in spectral sensitivity for each pixel.

In addition, according to the second embodiment of the present invention, the correction factor calculating unit 307 calculates a neighborhood average value by using pixel values of surrounding pixels of a pixel of interest, and calculates a correction factor for correcting variation in spectral sensitivity for each pixel based on the neighborhood average value and the pixel value of the pixel of interest, which allows calculation of correction factors with high accuracy even if the object has certain unevenness.

In addition, according to the second embodiment of the present invention, the correction amount calculating unit 404 calculates correction amounts for some colors in predetermined wavelength ranges, which allows calculation of the correction amounts with a reduced amount of computation while the visual correction effect is maintained.

In the second embodiment of the present invention, since a color component of a pixel of interest (for example, a G component of a G pixel) may also vary in spectral sensitivity, correction factors for color components of a pixel of interest may similarly be calculated. In this case, the correction factor calculating unit 307 may calculate a correction factor for a color component of a pixel of interest by calculating a neighborhood average value of the pixel of interest from the pixel values of surrounding pixels having the same color filter as that of the pixel of interest based on an image obtained by capturing illumination light of the same color as the pixel of interest, calculating a difference between the neighborhood average value and the pixel value of the pixel of interest as an error quantity, and dividing the error quantity by the neighborhood average value of the pixel of interest.

Third Embodiment

Next, a third embodiment of the present invention will be described. While the imaging device 10, the first image processing apparatus 30, and the second image processing apparatus 40 are provided separately in the first and second embodiments described above, a first image processing apparatus and a second image processing apparatus are provided in an imaging device in the third embodiment. Thus, in the following, a configuration of the imaging system according to the third embodiment will be described. The same elements as those in the imaging system 1 according to the first embodiment will be denoted by the same reference signs, and the explanation thereof will not be repeated.

Configuration of Imaging System

Figure 26:
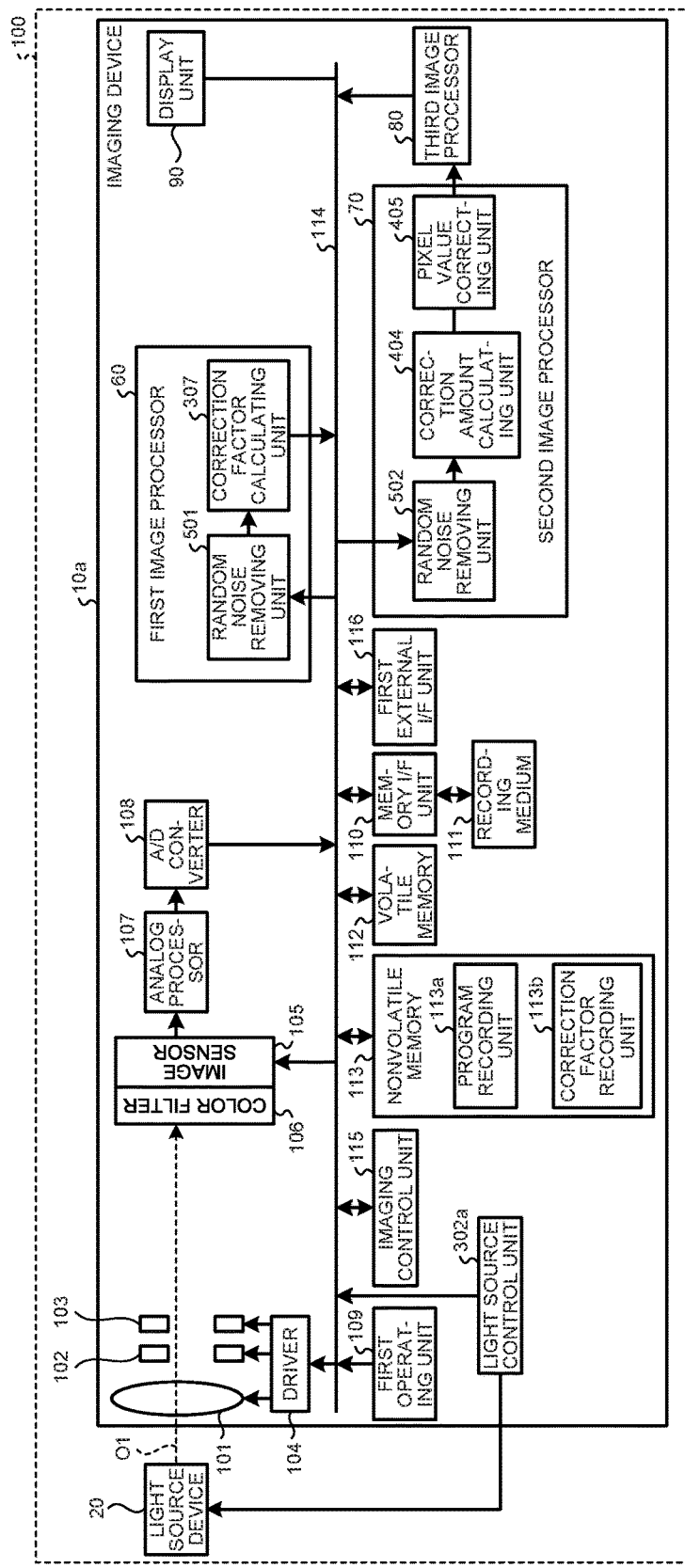
FIG. 26 is a block diagram schematically illustrating a configuration of an imaging device according to a third embodiment of the present invention.

FIG. 26 is a block diagram schematically illustrating a configuration of the imaging device according to the third embodiment of the present invention. An imaging device 10a illustrated in FIG. 26 is located in the casing 100 for calculation of correction factors and is located outside of the casing 100 for normal capturing. In addition, for calculation of correction factors, the imaging device 10a is connected to the light source device 20 via a communication cable or the like. The imaging device 10a includes a light source control unit 302a, a first image processor 60, a second image processor 70, a third image processor 80, and a display unit 90, in addition to the configuration of the imaging device 10 according to the first embodiment described above.

The first image processor 60 includes a random noise removing unit 501 and a correction factor calculating unit 307.

The random noise removing unit 501 removes random noise from image data generated by the image sensor 105, and outputs the image data resulting from the removal to the correction factor calculating unit 307. The random noise removing unit 501 removes random noise generated in each of a plurality of pixels constituting an image corresponding to the image data by using a known technique.

The second image processor 70 includes a random noise removing unit 502, a correction amount calculating unit 404, and a pixel value correcting unit 405.

The random noise removing unit 502 has similar functions as those of the random noise removing unit 501 described above, removes random noise from image data generated by the image sensor 105, and outputs the image data resulting from the removal to the correction amount calculating unit 404.

The third image processor 80 has functions similar to those of the image processor 406 described above, performs predetermined image processing on image data whose pixel values are corrected by the pixel value correcting unit 405, and outputs the image data resulting from the image processing to the display unit 90.

The display unit 90 displays various kinds of information on the imaging device 10a and an image corresponding to the image data. The display unit 90 includes a display panel of liquid crystal, organic EL, or the like.

In the imaging device 10a having the configuration as described above, the first image processor 60 and the second image processor 70 perform processing similar to that in the first and second embodiments described above. Specifically, the first image processor 60 performs the processing for calculating correction factors, and the second image processor 70 performs the processing for correction with correction amounts.

According to the third embodiment described above, the same advantageous effects as those of the first and second embodiments are obtained.

Other Embodiments

Figures 27, 28:
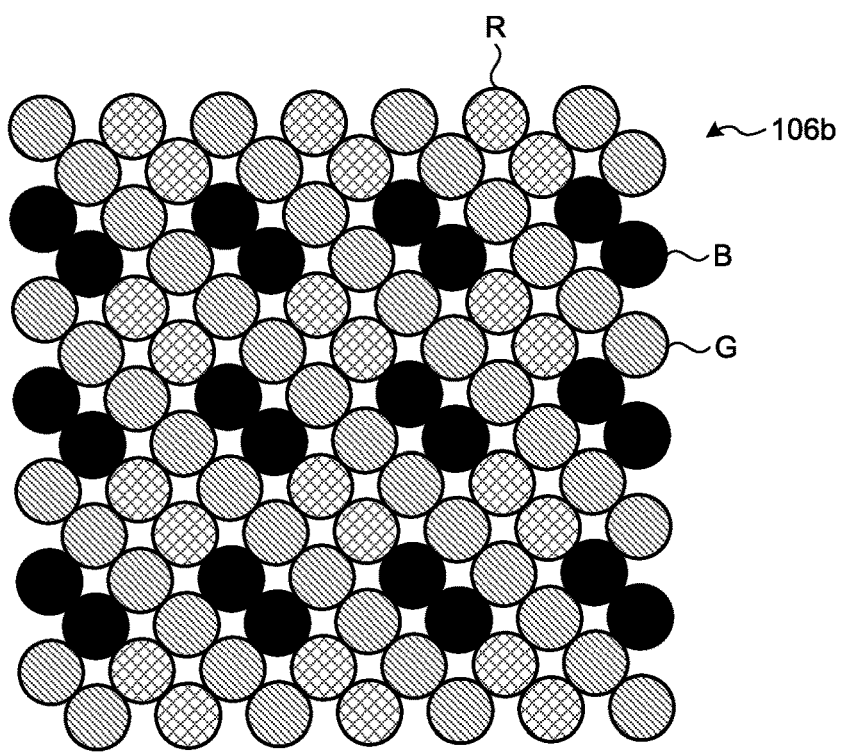
FIG. 27 is a diagram schematically illustrating a configuration of a color filter according to a first modification of the first to third embodiment of the present invention.
FIG. 28 is a diagram schematically illustrating a configuration of a color filter according to a second modification of the first to third embodiment of the present invention.
Figure 29:
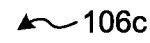
FIG. 29 is a diagram schematically illustrating a configuration of a color filter according to a third modification of the first to third embodiment of the present invention.

While the color filter 106 according to the first to third embodiments of the present invention is a color filter having a Bayer array constituted by R filters, G filters, and B filters, the present invention can also be applied to other color filters. In the present invention, as illustrated in FIG. 27, a color filter 106a constituted by Mg (magenta) filters being a complementary color, G filters, and B filters may be used instead of the R filters of the color filter 106 according to the first to third embodiments described above. Alternatively, in the present invention, as illustrated in FIG. 28, a color filter 106b constituted by R filters, G filters, and B filters, which are arranged diagonally, may be used. Under the circumstances illustrated in FIG. 28, the pixels of the image sensor are also arranged diagonally. Furthermore, in the present invention, as illustrated in FIG. 29, a color filter of complementary colors including Cy (cyan) filters, Mg filters, and Ye (yellow) filters may be used. When the color filter 106c illustrated in FIG. 29 is used, a known interpolation method of interpolation from complementary colors to primary colors may be used.

Furthermore, while a plurality of types of color filters having different spectral transmittances are provided on one image sensor in the first to third embodiments of the present invention, the present invention is also applicable to a two-image-sensor type imaging device including an image sensor in which only G filters transmitting a green wavelength range are provided on the light receiving surfaces of the pixels or over the entire surface of the image sensor, and an image sensor in which R filters and B filters transmitting red and blue wavelength ranges, respectively, are provided alternately in a checkerboard pattern on the light receiving surfaces of the pixels, for example. In this case, for calculation of a correction factor of a G pixel of one of the image sensors, the pixel values of an R pixel or a B pixel of the other image sensor corresponding to the coordinates of the G pixel can be used, allowing calculation of the correction factors and the correction amounts according to the present invention.

The present invention is not limited to the embodiments described above, but various modifications and applications can be made within the scope of the present invention. For example, the present invention is also applicable to any devices capable of capturing an object, such as portable devices such as portable phones and smart phones having image sensors, imaging devices for capturing an object through optical devices such as video cameras, endoscopes, surveillance cameras, and microscopes, in addition to the imaging devices used for description of the present invention.

Furthermore, such terms as "first," "next," "subsequently," and "thereafter" are used herein for convenience to explain operations in the description of operational flowcharts described above, these terms do not mean that the operations are to be performed in this order.

In addition, any of the techniques in the processes performed by the image processing apparatuses, that is, the processes illustrated in the flowcharts in the embodiments described above can be stored as programs to be executed by a control unit such as a CPU. Alternatively, the programs can be stored and distributed in a storage medium of an external storage device such as a memory card (a ROM card, a RAM card, etc.), a magnetic disk (a floppy disk, a hard disk, etc.), an optical disk (a CD-ROM, a DVD, etc.) and a semiconductor memory. A control unit such as a CPU can then read the programs stored in the storage medium of the external storage device, and execute the processing described above by operations controlled by the read programs.

According to some embodiments, it is possible to calculate a correction factor for correcting variation in spectral sensitivity of each of a plurality of pixels of an image sensor.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An image processing apparatus comprising:
a processor comprising hardware, wherein the processor is configured to:
    acquire image data from an image sensor, the image sensor comprising a pixel of interest in which a color filter of a first color is disposed and one or more additional pixels on which color filters of the first color are disposed;
    determine a spectral sensitivity characteristic in a first predetermined wavelength range of the pixel of interest;
    determine a spectral sensitivity characteristic in the first predetermined wavelength range of each of the one or more additional pixels;
    determine a reference spectral sensitivity in the first predetermined wavelength range based on the spectral sensitivity characteristic in the first predetermined wavelength range of the each of the one or more additional pixels;
    determine a difference between the spectral sensitivity characteristic of the pixel of interest and the reference spectral sensitivity in the first predetermined wavelength range; and
    determine a correction factor for correcting a pixel value in the first predetermined wavelength range of the pixel of interest based on the difference.

2. The image processing apparatus according to claim 1, wherein the image sensor comprises the pixel of interest and the one or more additional pixels in which the color filters of the first color are disposed, and another pixel in which a color filter of a second color is disposed, and wherein the processor is configured to determine the correction factor in the predetermined wavelength range including a wavelength range where the first color has a lower spectral transmittance than the second color.

3. The image processing apparatus according to claim 1, wherein the image sensor comprises the pixel of interest and the one or more additional pixels in which the color filters of the first color are disposed, and another pixel in which a color filter of a second color is disposed, and wherein the processor is configured to determine the correction factor in the predetermined wavelength range including a wavelength range where the first color has a higher spectral transmittance than the first color.

4. The image processing apparatus according to claim 1, wherein the processor is configured to determine the reference spectral sensitivity based on one of:
    the spectral sensitivity characteristic in the first predetermined wavelength range of the pixel of interest and the spectral sensitivity characteristic in the first predetermined wavelength range of the each of the one or more additional pixels; and
    the spectral sensitivity characteristic in the first predetermined wavelength range of the each of the one or more additional pixels.

5. The image processing apparatus according to claim 4, wherein the processor is configured to:
    determine, as the reference spectral sensitivity, an average value of the spectral sensitivity characteristics of the one or more additional pixels; or
    determine, as the reference spectral sensitivity, an average value of spectral sensitivity characteristics of pixels of the one or more additional pixels located around the pixel of interest.

6. The image processing apparatus according to claim 1, wherein the processor is configured to determine the correction factor for each of light sources that emit light of different wavelength characteristics.

7. The image processing apparatus according to claim 1, wherein the image sensor is configured to receive uniform light having a higher spectral radiance in the predetermined wavelength range than in other wavelength ranges to generate the image data.

8. The image processing apparatus according to claim 1, wherein the processor is configured to:
   remove random noise from the image data; and
   determine the correction factor for the image data after the random noise is removed.

9. The image processing apparatus according to claim 1, wherein the image sensor comprises pixels including the pixel of interest and the one or more additional pixels, wherein each of the pixels has a color filter of one of a plurality of colors disposed thereon, and
   wherein the plurality of colors includes red, green, and blue.

10. The image processing apparatus according to claim 1, wherein the image sensor comprises pixels including the pixel of interest and the one or more additional pixels, wherein each of the pixels has a color filter of one of a plurality of colors disposed thereon, and
    wherein the plurality of colors includes cyan, magenta, yellow, and green.

11. The image processing apparatus according to claim 1, wherein the processor is configured to correct the image data based on the correction factor determined.

12. An image processing method executed by a computer, the image processing method comprising:
    acquiring image data from an image sensor, the image sensor comprising a pixel of interest in which a color filter of a first color is disposed and one or more additional pixels on which color filters of the first color are disposed;
    determining a spectral sensitivity characteristic in a first predetermined wavelength range of the pixel of interest;
    determining a spectral sensitivity characteristic in the first predetermined wavelength range of each of the one or more additional pixels;
    determining a reference spectral sensitivity in the first predetermined wavelength range based on the spectral sensitivity characteristic in the first predetermined wavelength range of the each of the one or more additional pixels;
    determining a difference between the spectral sensitivity characteristic of the pixel of interest and the reference spectral sensitivity in the first predetermined wavelength range; and
    determining a correction factor for correcting a pixel value in the first predetermined wavelength range of the pixel of interest based on the difference.

13. The image processing method according to claim 12, wherein the image processing method comprises correcting the image data based on the correction factor determined.

14. A non-transitory computer-readable recording medium with an executable program stored thereon, the program causing a computer to:
    acquire image data from an image sensor, the image sensor comprising a pixel of interest in which a color filter of a first color is disposed and one or more additional pixels on which color filters of the first color are disposed;
    determine a spectral sensitivity characteristic in a first predetermined wavelength range of the pixel of interest;
    determine a spectral sensitivity characteristic in the first predetermined wavelength range of each of the one or more additional pixels;
    determine a reference spectral sensitivity in the first predetermined wavelength range based on the spectral sensitivity characteristic in the first predetermined wavelength range of the each of the one or more additional pixels;
    determine a difference between the spectral sensitivity characteristic of the pixel of interest and the reference spectral sensitivity in the first predetermined wavelength range; and
    determine a correction factor for correcting a pixel value in the first predetermined wavelength range of the pixel of interest based on the difference.

15. The non-transitory computer-readable recording medium according to claim 14, wherein the program causes the computer to correct the image data based on the correction factor determined.

* * * * *